United States Patent
Yun

(10) Patent No.: US 12,557,412 B2
(45) Date of Patent: Feb. 17, 2026

(54) IMAGE SENSOR PACKAGE

(71) Applicant: SAMSUNG ELECTRONICS CO., LTD., Suwon-si (KR)

(72) Inventor: Youngmin Yun, Sejong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 386 days.

(21) Appl. No.: 18/105,007

(22) Filed: Feb. 2, 2023

(65) Prior Publication Data

US 2023/0253426 A1  Aug. 10, 2023

(30) Foreign Application Priority Data

Feb. 4, 2022  (KR) .......... 10-2022-0015075

(51) Int. Cl.
  *H10F 39/00*  (2025.01)
  *H04N 25/60*  (2023.01)
  *H10F 39/18*  (2025.01)

(52) U.S. Cl.
  CPC .......... *H10F 39/804* (2025.01); *H04N 25/60* (2023.01); *H10F 39/011* (2025.01);
  (Continued)

(58) Field of Classification Search
  CPC ......... H01L 27/14623; H01L 27/14618; H01L 27/14636; H01L 27/14685; H01L 23/04;
  (Continued)

(56) References Cited

U.S. PATENT DOCUMENTS 7,202,899 B2  4/2007  Lin et al.
8,063,462 B2  11/2011  Tanida et al.
(Continued)

FOREIGN PATENT DOCUMENTS

KR  10-2002-0096198 A  12/2002
KR  10-2006-0059873 A  6/2006
(Continued)

OTHER PUBLICATIONS

Communication issued on Sep. 25, 2025 by the Korean Intellectual Property Office in Korean Patent Application No. 10-2022-0015075.

*Primary Examiner* — Jonathan Han
(74) *Attorney, Agent, or Firm* — Sughrue Mion, PLLC

(57) ABSTRACT

An image sensor package includes an image sensor chip including an active pixel sensor region including a plurality of unit pixels, a perimeter region, and a pad region and including a plurality of chip pads. The image sensor package also includes a printed circuit board under the image sensor chip and including a plurality of bonding pads, bonding wires connecting the plurality of chip pads to the plurality of bonding pads, respectively, and a bonding dam around the active pixel sensor region. The image sensor package also includes a cover glass on the bonding dam and above the image sensor chip, and an encapsulation layer to cover all of a side surface portion of the bonding dam, a side surface portion of the cover glass, and an edge portion of an upper surface of the printed circuit board. The perimeter region includes a plurality of block patterns separated from each other. The plurality of block patterns confine the bonding dam during fabrication and reduce thermal stress when the image sensor package is in use.

20 Claims, 21 Drawing Sheets

(52) U.S. Cl.
CPC ....... *H10F 39/182* (2025.01); *H10F 39/8053* (2025.01); *H10F 39/8063* (2025.01); *H10F 39/811* (2025.01)

(58) Field of Classification Search
CPC ......... H01L 24/14; H01L 24/17; H01L 24/46; H01L 24/49; H01L 25/0652; H01L 25/0655; H10F 39/804; H10F 39/011; H10F 39/182; H10F 39/8053; H10F 39/8063; H10F 39/811; H10F 39/809; H04N 25/60
See application file for complete search history.

(56) References Cited

U.S. PATENT DOCUMENTS

| | | | |
|---|---|---|---|
| 8,587,082 B2 | 11/2013 | Yukawa et al. | |
| 9,413,343 B2 | 8/2016 | Yoo | |
| 10,573,679 B2 | 2/2020 | Kwon | |
| 2005/0041134 A1* | 2/2005 | Takayama | H10F 39/806 257/E31.127 |
| 2013/0175650 A1 | 7/2013 | Gleason | |
| 2020/0350351 A1 | 11/2020 | Yoo et al. | |
| 2020/0373341 A1* | 11/2020 | Jo | H01L 24/49 |
| 2021/0202557 A1 | 7/2021 | Yi | |
| 2022/0113242 A1 | 4/2022 | Lee | |

FOREIGN PATENT DOCUMENTS

| | | |
|---|---|---|
| KR | 10-2009-0065980 A | 6/2009 |
| KR | 1020110077416 A | 7/2011 |
| KR | 1020190045642 A | 5/2019 |
| KR | 102130960 B1 | 7/2020 |
| KR | 102158273 B1 | 9/2020 |
| KR | 10-2020-0133495 A | 11/2020 |
| KR | 102252490 B1 | 5/2021 |
| KR | 1020210084149 A | 7/2021 |
| TW | 200308058 A | 12/2003 |

\* cited by examiner

US 12,557,412 B2

IMAGE SENSOR PACKAGE

CROSS-REFERENCE TO RELATED APPLICATION

This application is based on and claims priority under 35 U.S.C. § 119 to Korean Patent Application No. 10-2022-0015075, filed on Feb. 4, 2022, in the Korean Intellectual Property Office, the disclosure of which is incorporated by reference herein in its entirety.

BACKGROUND

Embodiments relate to an image sensor package, and more particularly, to an image sensor package of which a package size may be reduced and the package reliability may be improved.

An image sensor package used in a camera, e.g., a vehicle camera, requires a small package size. It is required to reduce the sizes of various kinds of components, e.g., an image sensor chip, included in an image sensor package. In addition, it is required to improve the package reliability of an image sensor package.

SUMMARY

Embodiments provide an image sensor package of which a package size may be reduced and the package reliability may be improved.

Provided herein is an image sensor package including an image sensor chip comprising an active pixel sensor region including a plurality of unit pixels, a perimeter region in a first circumference of the active pixel sensor region, and a pad region in a second circumference of the perimeter region and including a plurality of chip pads; a printed circuit board under the image sensor chip and including a plurality of bonding pads; bonding wires connecting the plurality of chip pads to the plurality of bonding pads, respectively; a bonding dam around the active pixel sensor region; a cover glass on the bonding dam and above the image sensor chip; and an encapsulation layer to cover all of a first side surface portion of the bonding dam, a second side surface portion of the cover glass, and a first edge portion of a first upper surface of the printed circuit board, wherein the perimeter region comprises a plurality of block patterns to be separated from each other.

Also provided herein is another image sensor package including an image sensor chip comprising an active pixel sensor region including a plurality of unit pixels, a perimeter region in a first circumference of the active pixel sensor region, and a pad region in a second circumference of the perimeter region and including a plurality of chip pads; a printed circuit board under the image sensor chip and including a plurality of bonding pads; bonding wires connecting the plurality of chip pads to the plurality of bonding pads, respectively; a bonding dam around the active pixel sensor region; a cover glass on the bonding dam and above the image sensor chip; and an encapsulation layer to cover all of a first side surface portion of the bonding dam, a second side surface portion of the cover glass, and a first edge portion of a first upper surface of the printed circuit board, wherein the perimeter region comprises a plurality of block patterns in a mesh shape to be separated from each other and a perimeter passivation layer completely covering the plurality of block patterns.

Also provided herein is yet another an image sensor package including an image sensor chip comprising an active pixel sensor region including a plurality of unit pixels, a perimeter region in a first circumference of the active pixel sensor region, and a pad region in a second circumference of the perimeter region and including a plurality of chip pads; a printed circuit board under the image sensor chip and including a plurality of bonding pads; bonding wires connecting the plurality of chip pads to the plurality of bonding pads, respectively; a bonding dam around the active pixel sensor region; a cover glass on the bonding dam and above the image sensor chip; and an encapsulation layer to cover all of a first side surface portion of the bonding dam, a second side surface portion of the cover glass, and an edge portion of a first upper surface of the printed circuit board, wherein the active pixel sensor region comprises a color filter layer, a planarization layer on the color filter layer, a micro-lens layer on the planarization layer, and a passivation layer on the micro-lens layer, and the perimeter region comprises a plurality of block patterns to be separated from each other and a perimeter passivation layer covering the plurality of block patterns and having the same level as a third upper surface of the passivation layer.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, exemplary embodiments are described in detail with reference to the accompanying drawings. The embodiments to be described below may be implemented individually or by a combination of two or more of the embodiments.

Figure 1:
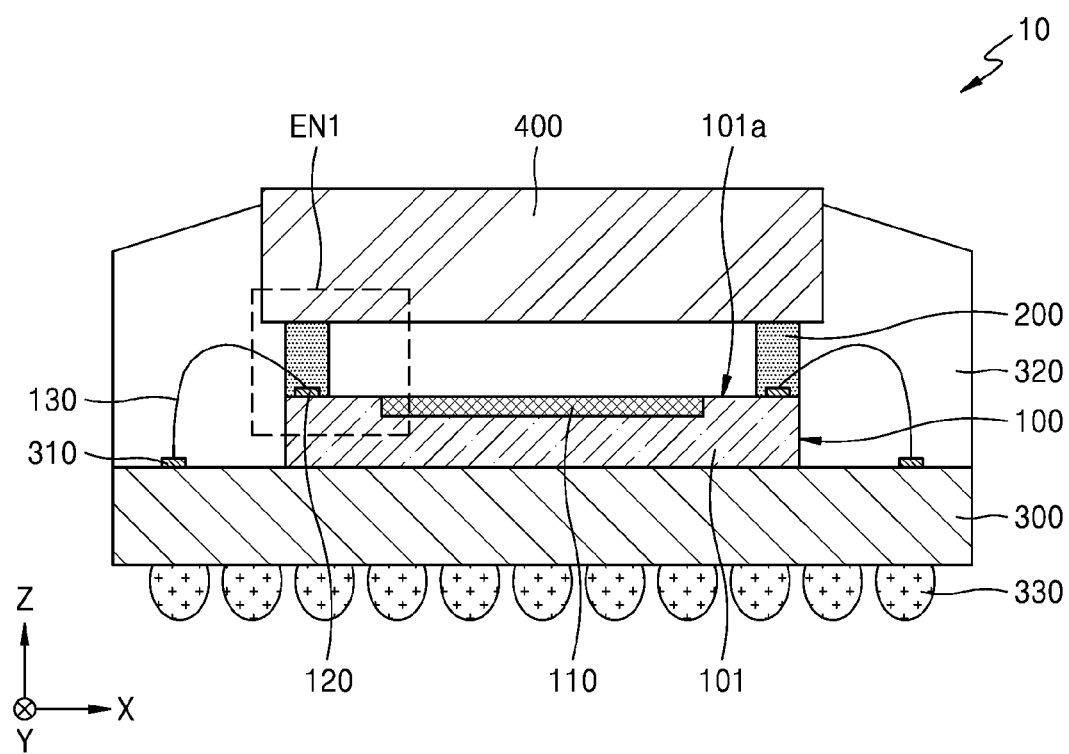
FIG. 1 is a cross-sectional view of an image sensor package according to an embodiment.
Figure 2:
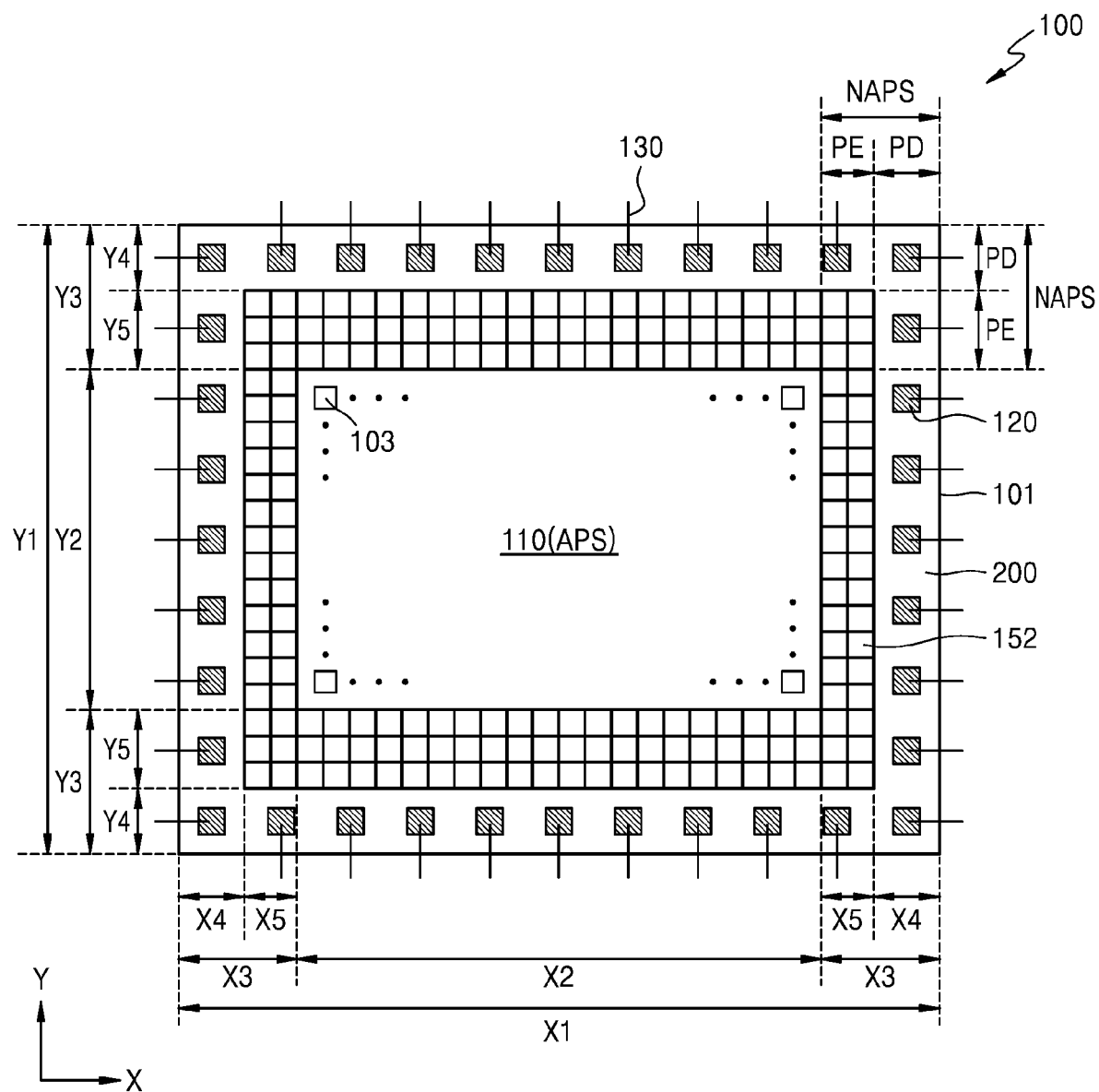
FIG. 2 is a top view of an image sensor chip of FIG. 1.
Figure 3:
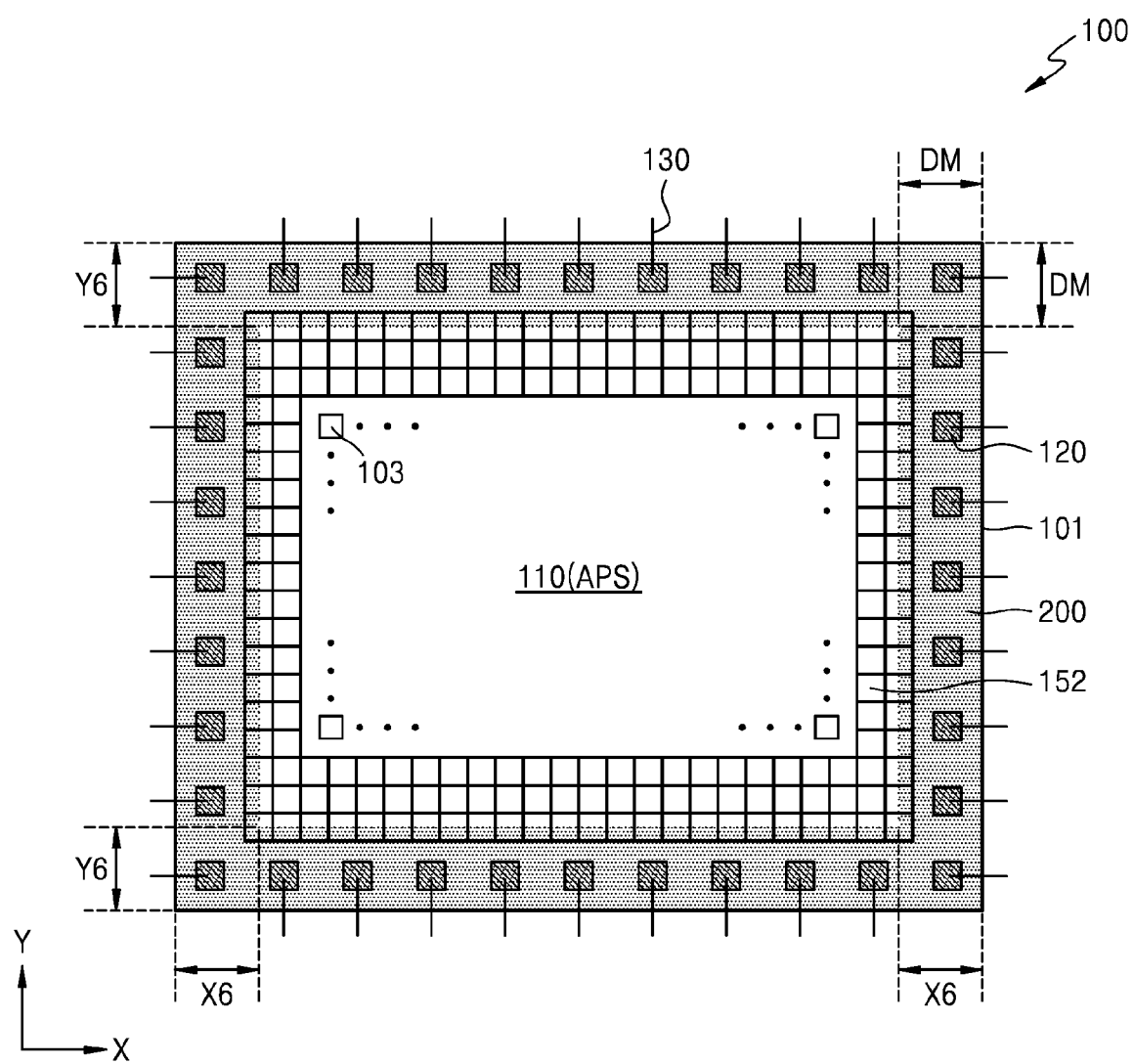
FIG. 3 is a top view of a bonding dam attached onto the image sensor chip of FIG. 2.

FIG. 1 is a cross-sectional view of an image sensor package 10 according to an embodiment, FIG. 2 is a top view of an image sensor chip 100 of FIG. 1, and FIG. 3 is a top view of a bonding dam 200 attached onto the image sensor chip 100 of FIG. 2.

The image sensor package 10 may include the image sensor chip 100, bonding wires 130, the bonding dam 200, a printed circuit board (PCB) 300, an encapsulation layer 320, a plurality of bumps 330, and a cover glass 400.

The image sensor chip 100 may include an active pixel sensor (APS) region 110, in which a plurality of unit pixels 103 are arranged in an array form. As shown in FIG. 2, a non-sensing region NAPS may be formed in the circumference of the APS region 110. The non-sensing region NAPS may be in an edge portion of the image sensor chip 100 and surround the APS region 110.

The non-sensing region NAPS may include the perimeter region PE formed in the circumference of the APS region 110, and a pad region PD located in the circumference of the perimeter region PE and including a plurality of chip pads 120. The perimeter region PE may be a perimeter color region for removing noise due to light reflection. The perimeter region PE may be referred to as a bulk region or a bulk color region.

The pad region PD may be a region in which the plurality of chip pads 120 for electrical connection to the PCB 300 are formed. The plurality of chip pads 120 in the pad region PD may be formed of a conductive metal (e.g., aluminum or copper).

In some embodiments, when the image sensor chip 100 is a back side illumination (BSI) chip, a first surface 101a of a semiconductor substrate 101 may be a rear surface. In some embodiments, when the image sensor chip 100 is a front side illumination (FSI) chip, the first surface 101a of the semiconductor substrate 101 may be a front surface.

Each of the plurality of unit pixels 103 provided in the APS region 110 may generate an image signal by sensing light by using a photodiode (PD), and converting the sensed light into an electrical signal. Each of the plurality of unit pixels 103 may include a complementary metal oxide semiconductor (CMOS) image sensor. However, each of the plurality of unit pixels 103 is not limited thereto and may include a charge-coupled device (CCD) image sensor.

The bonding dam 200 may be formed between the image sensor chip 100 and the cover glass 400 and bond the image sensor chip 100 with the cover glass 400. The cover glass 400 may be on the bonding dam 200 and above the image sensor chip 100. The cover glass 400 may be coated with an anti-reflective layer. In some embodiments, the width (or length) of the image sensor chip 100 may be formed to be the same as the width (or length) of the cover glass 400 (or length) in an X-axis direction and a Y-axis direction.

In some embodiments, the cover glass 400 may be formed to have a greater width (or length) than the image sensor chip 100 in the X-axis direction and the Y-axis direction. In some embodiments, the cover glass 400 may have a thickness of about 200 μm to about 500 μm.

A plurality of bonding pads 310 are formed on an edge portion of an upper surface of the PCB 300. The plurality of bonding pads 310 may be formed of a conductive material (e.g., copper). The plurality of chip pads 120 of the image sensor chip 100 may be connected to the plurality of bonding pads 310 of the PCB 300 by the bonding wires 130, respectively.

The image sensor chip 100 may be electrically connected to circuits on the PCB 300 through the bonding wires 130. In some embodiments, a height of the bonding wire 130 may be about 50 μm to about 120 μm from the first surface 101a of the semiconductor substrate 101. The plurality of bumps 330 may be formed on a lower surface of the PCB 300.

As shown in FIG. 2, the image sensor chip 100 may have a width (or distance) X1 in the X-axis direction. The APS region 110 of the image sensor chip 100 may have a width (or distance) X2 in the X-axis direction. A total width (or total distance) 2X3 of the non-sensing region NAPS in the X-axis direction may be obtained by subtracting the width X2 of the APS region 110 in the X-axis direction from the width X1 of the image sensor chip 100 in the X-axis direction.

The non-sensing region NAPS may be arranged at each of left and right sides of the APS region 110 in the X-axis direction. The widths (or distances) X3 of the non-sensing region NAPS arranged at the left and right sides of the APS region 110 in the X-axis direction may be identical to each other. The width X3 of the non-sensing region NAPS arranged at each of the left and right sides of the APS region 110 in the X-axis direction may be obtained by dividing the total width 23 of the non-sensing region NAPS in the X-axis direction by 2.

The non-sensing region NAPS arranged at each of the left and right sides of the APS region 110 in the X-axis direction may include the perimeter region PE and the pad region PD. The perimeter region PE may have a width (or distance) X5 in the X-axis direction. The pad region PD may have a width (or distance) X4 in the X-axis direction. The width X3 of the non-sensing region NAPS arranged at each of the left and right sides of the APS region 110 in the X-axis direction may be obtained by adding the width X5 of the perimeter region PE arranged at each of the left and right sides of the APS region 110 in the X-axis direction to the width X4 of the pad region PD arranged at each of the left and right sides of the APS region 110 in the X-axis direction.

As shown in FIG. 2, the image sensor chip 100 may have a width (or distance) Y1 in the Y-axis direction. The width (or distance) Y1 in the Y-axis direction may be less than the width X1 in the X-axis direction. For example, the width (or distance) Y1 in the Y-axis direction may be three-fourths (¾) of the width X1 in the X-axis direction. The APS region 110 of the image sensor chip 100 may have a width (or distance) Y2 in the Y-axis direction. A total width (or total distance) 2Y3 of the non-sensing region NAPS in the Y-axis direction may be obtained by subtracting the width Y2 of the APS region 110 in the Y-axis direction from the width Y1 of the image sensor chip 100 in the Y-axis direction.

The non-sensing region NAPS may be arranged at each of upper and lower sides of the APS region 110 in the Y-axis direction. The widths (or distances) Y3 of the non-sensing region NAPS arranged at the upper and lower sides of the APS region 110 in the Y-axis direction may be identical to each other. The width Y3 of the non-sensing region NAPS arranged at each of the upper and lower sides of the APS region 110 in the Y-axis direction may be obtained by dividing the total width 2Y3 of the non-sensing region NAPS in the Y-axis direction by 2.

The non-sensing region NAPS arranged at each of the upper and lower sides of the APS region 110 in the Y-axis direction may include the perimeter region PE and the pad region PD. The perimeter region PE may have a width (or distance) Y5 in the Y-axis direction. The pad region PD may have a width (or distance) Y4 in the Y-axis direction. The width Y3 of the non-sensing region NAPS arranged at each of the upper and lower sides of the APS region 110 in the Y-axis direction may be obtained by adding the width Y5 of the perimeter region PE arranged at each of the upper and lower sides of the APS region 110 in the Y-axis direction to the width Y4 of the pad region PD arranged at each of the upper and lower sides of the APS region 110 in the Y-axis direction.

In some embodiments, the image sensor chip 100 may be formed with the width X1 in the X-axis direction as several mm to tens of mm, e.g., about 4 mm to about 36 mm, and the APS region 110 may be formed with the width X2 in the X-axis direction as several mm to tens of mm, e.g., about 3 mm to about 32 mm. The width X3 of the non-sensing region NAPS arranged at each of the left and right sides of the APS region 110 in the X-axis direction may be about 2 mm or less.

In addition, the image sensor chip 100 may be formed with the width Y1 in the Y-axis direction as several mm to tens of mm, e.g., about 3 mm to about 24 mm, and the APS region 110 may be formed with the width Y2 in the Y-axis direction as several mm to tens of mm, e.g., about 2 mm to about 20 mm. The width Y3 of the non-sensing region NAPS arranged at each of the upper and lower sides of the APS region 110 in the Y-axis direction may be about 2 mm or less.

As shown in FIGS. 2 and 3, the bonding dam 200 may be in the non-sensing region NAPS in the perimeter of the APS region 110. The bonding dam 200 may be formed in the perimeter region PE and the pad region PD in the perimeter of the APS region 110. The bonding dam 200 may include an adhesive, e.g., an epoxy adhesive. The perimeter region PE may include a plurality of block patterns 152 formed to be separated from each other.

The epoxy adhesive forming the bonding dam 200 may flow during fabrication. A flow of the epoxy to include the active pixel sensing (APS) region 110 would impair the operation of the active pixel sensing (APS) region 110. Including a space for transition of the flow to terminate before the active pixel sensing (APS) region 110 would require additional space.

The plurality of block patterns 152 may be formed in a mesh form in a top view. In other words, the plurality of block patterns 152 may be formed in a mesh form on an X-Y plane.

When the bonding dam 200 is formed, the plurality of block patterns 152 may prevent the bonding dam 200 from intruding into the APS region 110, and thus, the size of the image sensor chip 100 may be reduced, and accordingly, the size of the image sensor package 10 may be reduced.

For example, the plurality of block patterns 152 prevent undesired flow of the bonding dam 200 during fabrication and also eliminate a need for space related to the bonding dam 200. Thus required space for image sensor chip 100 is reduced.

In addition, the plurality of block patterns 152 may be formed in a mesh form so that stress resulting from a thermal expansion coefficient difference in the perimeter region PE is reduced. In other words, the plurality of block patterns 152 may suppress cracks from occurring (i.e., a crack occurrence phenomenon) in a perimeter passivation layer (146' of FIG. 4) and a passivation layer (146 of FIG. 4) due to a thermal expansion coefficient difference.

Because the plurality of block patterns 152 share some of the structural geometry of the active pixel sensing (APS) region 110, the plurality of block patterns 152 exhibit a thermal expansion coefficient not very different from the thermal expansion coefficient of the active pixel sensing (APS) region 110. This moderating thermal expansion coefficient is due in part to the mesh topology corresponding to different thermal expansion coefficients. That is, the mesh includes both block patterns 152 and a portion which separates adjacent block patterns 152. The similar thermal expansion coefficients (the mesh and the active pixel sensing (APS) region 110) translate into less physical deformation under thermal stress. Less physical deformation reduces cracks and reduce peeling, as explained below. Thus, the plurality of block patterns confine the bonding dam during fabrication (saving space) and also reduce thermal stress when the image sensor package is in use (by moderating differences in thermal expansion coefficients).

The plurality of block patterns 152 may be formed in a mesh form to suppress peeling of the image sensor chip 100 from the semiconductor substrate 101 (i.e., a peeling phenomenon). As a result, the plurality of block patterns 152 may contribute to improvement of the reliability of the image sensor package 10.

The bonding dam 200 may be in a dam region DM having a width (or distance) X6 in the X-axis direction at an edge of the image sensor chip 100. In other words, the bonding dam 200 may have the width (or distance) X6 in the X-axis direction at the edge of the image sensor chip 100. The width X6 of the bonding dam 200 in the X-axis direction, which is arranged in each of the left and right sides of the APS region 110, may be about 2 mm or less.

In addition, the bonding dam 200 may be in the dam region DM having a width (or distance) Y6 in the Y-axis direction at the edge of the image sensor chip 100. In other words, the bonding dam 200 may have the width (or distance) Y6 in the Y-axis direction at the edge of the image sensor chip 100. The width Y6 of the bonding dam 200 in the Y-axis direction, which is arranged in each of the upper and lower sides of the APS region 110, may be about 2 mm or less.

As shown in FIG. 1, the cover glass 400 may be on the bonding dam 200 and bonded with an upper part of the image sensor chip 100. The bonding dam 200 may be formed at an edge portion of the image sensor chip 100 and bond the cover glass 400 to the image sensor chip 100. The encapsulation layer 320 may be formed to cover all of a side surface portion of the image sensor chip 100, a side surface portion of the bonding dam 200, a side surface portion of the cover glass 400, and the edge portion of the upper surface of the PCB 300. As shown in FIG. 1, when a width of the cover glass 400 is greater than a width of the image sensor chip 100, the encapsulation layer 320 may also be formed at an edge portion of a lower surface of the cover glass 400.

The encapsulation layer 320 may be formed by applying an adhesive, such as an epoxy molding compound (EMC). The image sensor chip 100 may be bonded with the cover glass 400 by using the bonding dam 200 and the encapsulation layer 320.

Figure 4:
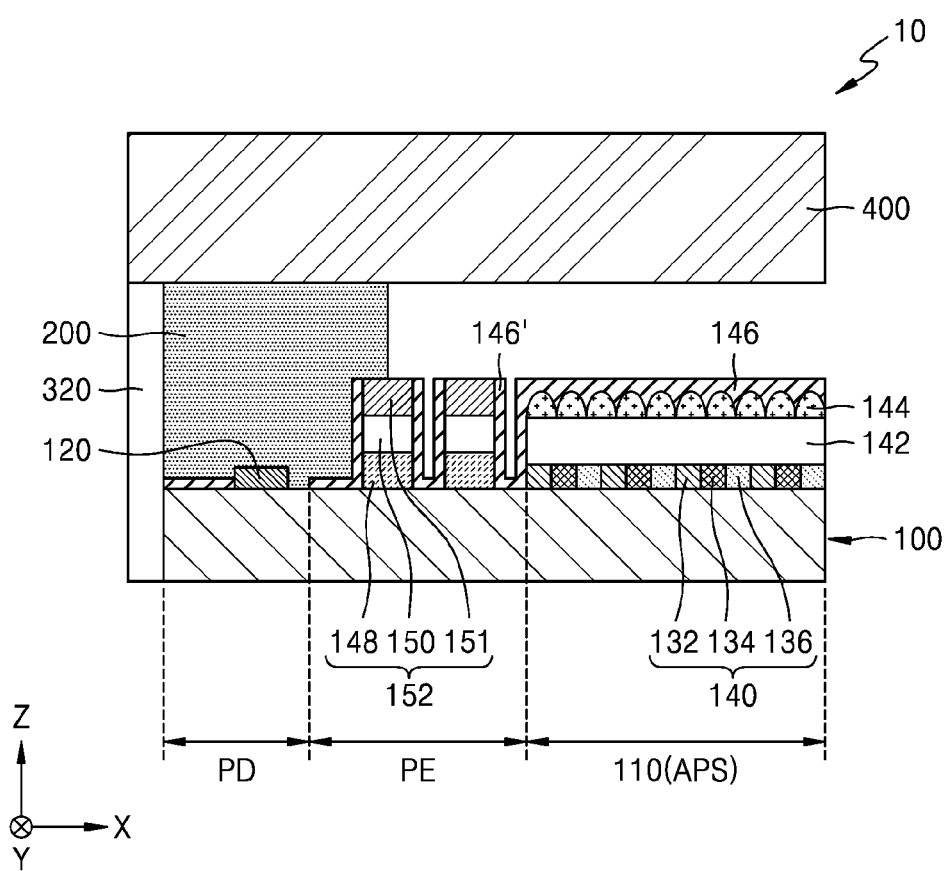
FIG. 4 is a partially enlarged cross-sectional view of an example of the image sensor package of FIG. 1.

FIG. 4 is a partially enlarged cross-sectional view of an example of the image sensor package 10 of FIG. 1.

Particularly, FIG. 4 is an enlarged cross-sectional view of a portion EN1 of the image sensor package 10 of FIG. 1. As described above, the image sensor package 10 may include the image sensor chip 100, the bonding dam 200, the encapsulation layer 320, and the cover glass 400.

The image sensor chip 100 may include the APS region 110, the perimeter region PE at one side of the APS region 110, and the pad region PD at one side of the perimeter region PE.

The APS region 110 may include a color filter layer 140, a planarization layer 142 on the color filter layer 140, a microlens layer 144 on the planarization layer 142, and a passivation layer 146 on the microlens layer 144.

The color filter layer 140 may include a red color layer 132, a green color layer 134, and a blue color layer 136. The planarization layer 142 may be a material layer introduced when an upper surface of the color filter layer 140 is uneven. The planarization layer 142 may include silicon oxide.

The microlens layer 144 may have a transmittance of about 90% or more with respect to light of a visible ray area. The light of the visible ray area may have a wavelength of about 380 nm to about 770 nm. The passivation layer 146 may be a material layer for protecting the APS region 110. The passivation layer 146 may include silicon nitride.

The perimeter region PE may include a plurality of block patterns, e.g., two block patterns 152, formed to be separated from each other. Each of the block patterns 152 may include a triple pattern including a perimeter color pattern 148, a perimeter planarization pattern 150 on the perimeter color pattern 148, and a perimeter passivation pattern 151 on the perimeter planarization pattern 150.

A perimeter passivation layer 146' between the block patterns 152 may be in the perimeter region PE. The perimeter passivation layer 146' may include the same material as that of the passivation layer 146 in the APS region 110.

In some embodiments, the perimeter color pattern 148 may be a black color pattern. The perimeter planarization pattern 150 may include the same material as that of the planarization layer 142 in the APS region 110. In some embodiments, an upper surface level of the perimeter planarization pattern 150 may be the same as an upper surface level of the planarization layer 142.

The pad region PD may include the plurality of chip pads 120. The plurality of chip pads 120 may be insulated by the perimeter passivation layer 146'. The bonding dam 200 may be in the pad region PD and in a portion of the perimeter region PE. The bonding dam 200 may cover an edge portion of an upper surface of the image sensor chip 100. The bonding dam 200 may be on the plurality of chip pads 120 by overlapping the plurality of chip pads 120.

As described above, when the bonding dam 200 is formed, the plurality of block patterns 152 may prevent the bonding dam 200 from intruding into the APS region 110, and thus, the size of the image sensor chip 100 may be reduced, and accordingly, the size of the image sensor package 10 may be reduced. In addition, as described above, the plurality of block patterns 152 may reduce stress resulting from a thermal expansion coefficient difference in the perimeter region PE to suppress a crack occurrence phenomenon and a peeling phenomenon of the image sensor package 10, thereby improving package reliability.

The encapsulation layer 320 may be formed to cover the side surface portion of the image sensor chip 100 and the side surface portion of the bonding dam 200. The cover glass 400 may be on a side surface portion of the encapsulation layer 320 and an upper surface of the bonding dam 200. Thus, in some embodiments, the encapsulation layers covers a first side surface portion of the bonding dam, a second side surface portion of the cover glass, and a first edge portion of a first upper surface of the printed circuit board. In some embodiments, the bonding dam is configured to cover a second edge portion of a second upper surface of the image sensor chip and to contact the plurality of chip pads by overlapping the plurality of chip pads. In some embodiments, the bonding dam is separated from the second edge portion of the second upper surface of the image sensor chip and does not overlap the plurality of chip pads.

Figure 5:
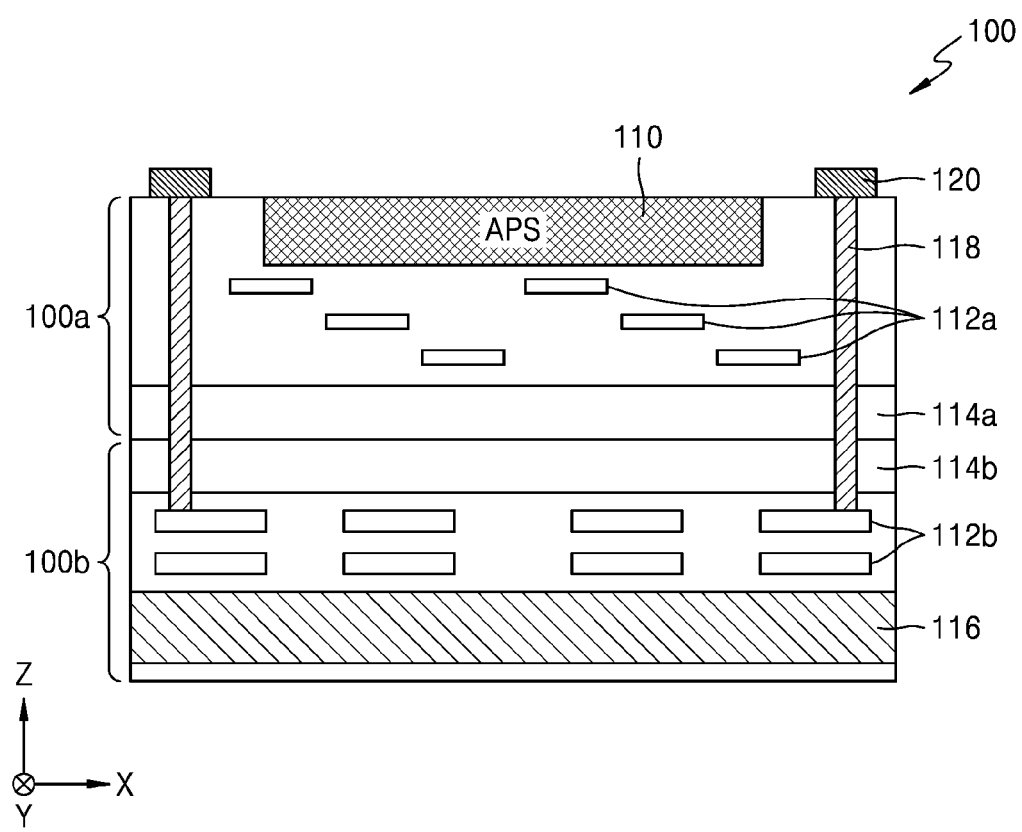
FIG. 5 is a cross-sectional view of an example of the image sensor chip of FIG. 1.

FIG. 5 is a cross-sectional view of an example of the image sensor chip 100 of FIG. 1.

Particularly, the image sensor chip 100 may include a first semiconductor substrate 100a and a second semiconductor substrate 100b. The first semiconductor substrate 100a and the second semiconductor substrate 100b may be bonded to each other to be the semiconductor substrate 101 described above.

The APS region 110, a plurality of first wirings 112a, and a first insulating layer 114a may be formed in the first semiconductor substrate 100a. A plurality of second wirings 112b, a second insulating layer 114b, and a driving circuit unit 116 configured to drive unit pixels formed in the APS region 110 may be formed in the second semiconductor substrate 100b.

The first semiconductor substrate 100a may be electrically connected to the second semiconductor substrate 100b by using a plurality of through electrodes 118. The plurality of chip pads 120 may be formed on an edge of an upper surface of the first semiconductor substrate 100a, and the plurality of chip pads 120 may be connected to the plurality of second wirings 112b of the second semiconductor substrate 100b by using the plurality of through electrodes 118, respectively.

The plurality of first wirings 112a formed in the first semiconductor substrate 100a may be connected to the plurality of second wirings 112b in the second semiconductor substrate 100b by using the plurality of through electrodes 118, respectively. The first semiconductor substrate 100a may be electrically connected to the second semiconductor substrate 100b by using the plurality of through electrodes 118. The through electrode 118 may include a through silicon via (TSV).

Figure 6:
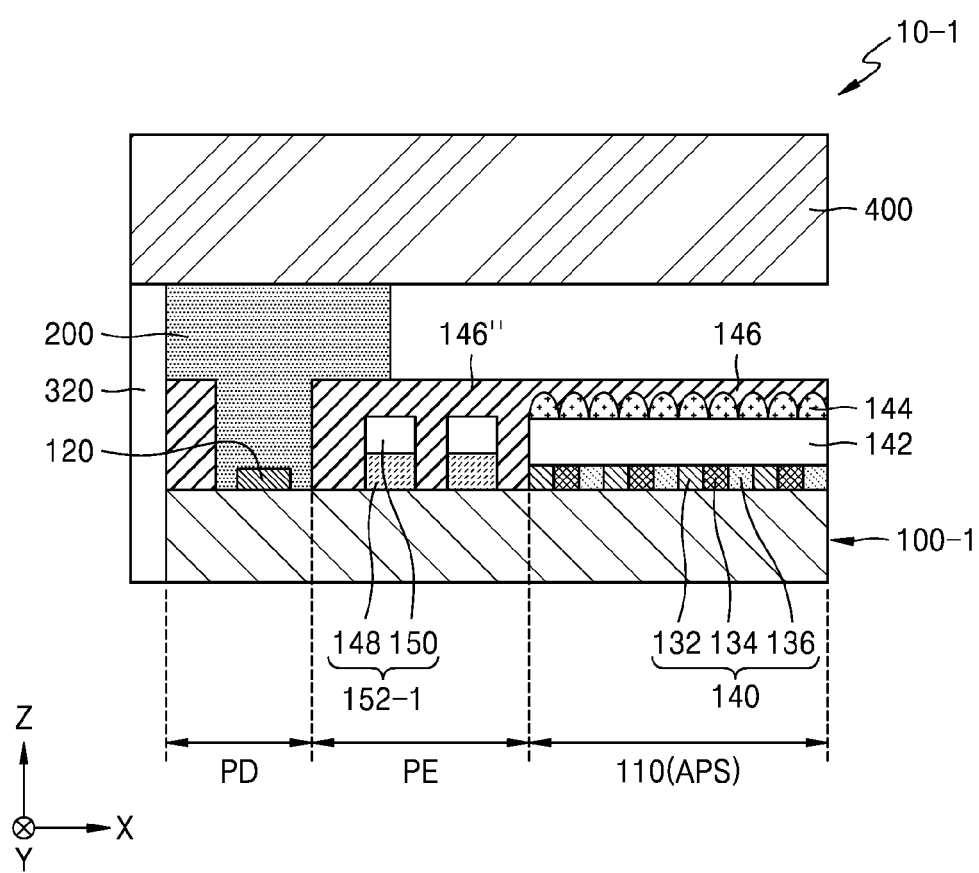
FIG. 6 is a partially enlarged cross-sectional view of an image sensor package according to an embodiment.

FIG. 6 is a partially enlarged cross-sectional view of an image sensor package 10-1 according to an embodiment.

Particularly, when compared with the image sensor package 10 of FIG. 4, the image sensor package 10-1 may be the same as the image sensor package 10 except for block patterns 152-1 and a perimeter passivation layer 146". In FIG. 6, a description made with reference to FIG. 4 is simply repeated or omitted.

The image sensor package 10-1 may include an image sensor chip 100-1, the bonding dam 200, the encapsulation layer 320, and the cover glass 400. The image sensor chip 100-1 may include the APS region 110, the perimeter region PE, and the pad region PD.

The APS region 110 may include the color filter layer 140, the planarization layer 142, the microlens layer 144, and the passivation layer 146. The color filter layer 140 may include the red color layer 132, the green color layer 134, and the blue color layer 136.

The perimeter region PE may include a plurality of block patterns, e.g., two block patterns 152-1, formed to be separated from each other. Each of the block patterns 152-1 may include a double pattern including the perimeter color pattern 148 and the perimeter planarization pattern 150 on the perimeter color pattern 148. The perimeter passivation layer 146" completely covering the block patterns 152-1 may be in the perimeter region PE. The perimeter passivation layer 146" may include the same material as that of the passivation layer 146 in the APS region 110.

In some embodiments, the perimeter color pattern 148 may be a black color pattern. The perimeter planarization pattern 150 may include the same material as that of the planarization layer 142 in the APS region 110. In some embodiments, the upper surface level of the perimeter planarization pattern 150 may be the same as the upper surface level of the planarization layer 142. An upper surface level of the perimeter passivation layer 146" may be the same as an upper surface level of the passivation layer 146.

The pad region PD may include the plurality of chip pads 120. The plurality of chip pads 120 may be separated by the perimeter passivation layer 146". The bonding dam 200 may be in the pad region PD and in a portion of the perimeter region PE. The bonding dam 200 may cover an edge portion of an upper surface of the image sensor chip 100-1. The bonding dam 200 may be on the plurality of chip pads 120 by overlapping the plurality of chip pads 120.

When the bonding dam 200 is formed, the plurality of block patterns 152-1 may prevent the bonding dam 200 from intruding into the APS region 110, and thus, the size of the image sensor chip 100-1 may be reduced, and accordingly, the size of the image sensor package 10-1 may be reduced. In addition, the plurality of block patterns 152-1 may reduce stress resulting from a thermal expansion coefficient difference in the perimeter region PE to suppress a crack occurrence phenomenon and a peeling phenomenon of the image sensor package 10-1, thereby improving package reliability.

The encapsulation layer 320 may be formed to cover a side surface portion of the image sensor chip 100-1 and the side surface portion of the bonding dam 200. The cover glass 400 may be on the side surface portion of the encapsulation layer 320 and the upper surface of the bonding dam 200.

Figure 7:
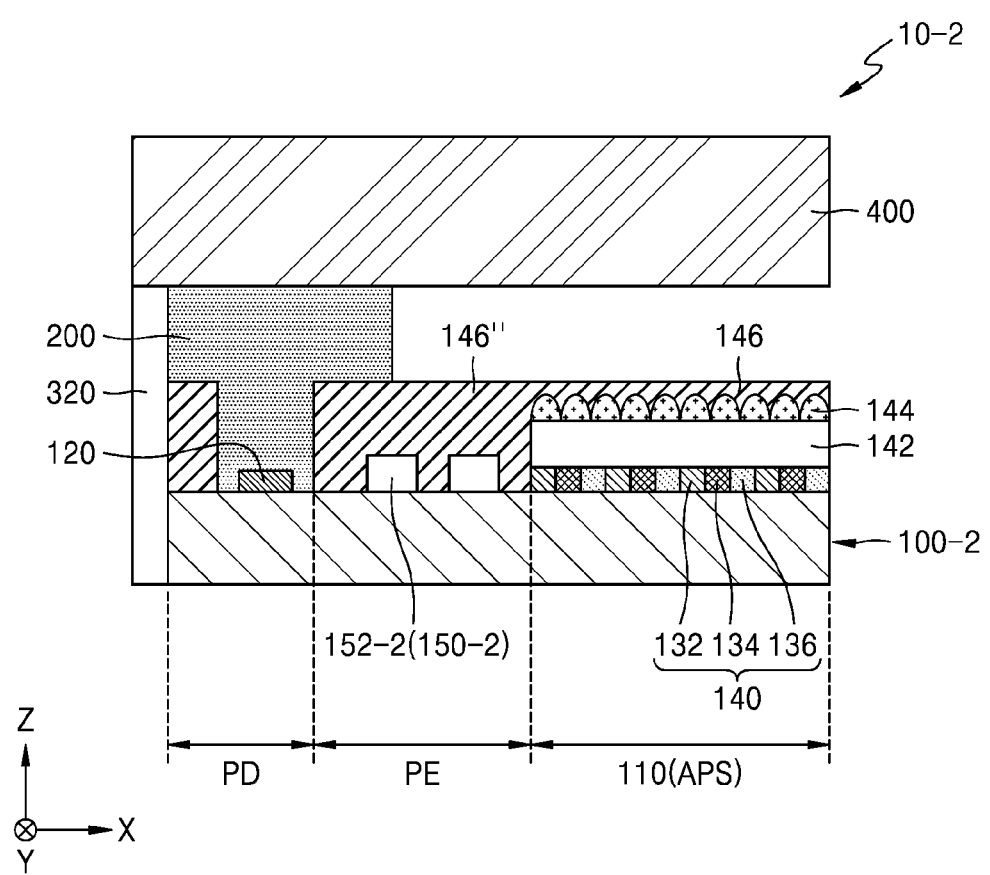
FIG. 7 is a partially enlarged cross-sectional view of an image sensor package according to an embodiment.

FIG. 7 is a partially enlarged cross-sectional view of an image sensor package 10-2 according to an embodiment.

Particularly, when compared with the image sensor package 10-1 of FIG. 6, the image sensor package 10-2 may be the same as the image sensor package 10-1 except for block patterns 152-2. In FIG. 7, a description made with reference to FIG. 6 is simply repeated or omitted.

The image sensor package 10-2 may include an image sensor chip 100-2, the bonding dam 200, the encapsulation layer 320, and the cover glass 400. The image sensor chip 100-2 may include the APS region 110, the perimeter region PE, and the pad region PD.

The APS region 110 may include the color filter layer 140, the planarization layer 142, the microlens layer 144, and the passivation layer 146. The color filter layer 140 may include the red color layer 132, the green color layer 134, and the blue color layer 136.

The perimeter region PE may include a plurality of block patterns, e.g., two block patterns 152-2, formed to be separated from each other. Each of the block patterns 152-2 may include a single pattern including a perimeter planarization pattern 150-2. For example, the perimeter color pattern 148 of FIG. 6 is not present in FIG. 7. The perimeter passivation layer 146" completely covering the block patterns 152-2 may be in the perimeter region PE. The perimeter passivation layer 146" may include the same material as that of the passivation layer 146 in the APS region 110.

In some embodiments, the perimeter planarization pattern 150 may include the same material as that of the planarization layer 142 in the APS region 110. The upper surface level of the perimeter passivation layer 146" may be the same as the upper surface level of the passivation layer 146.

The pad region PD may include the plurality of chip pads 120. The bonding dam 200 may be in the pad region PD and in a portion of the perimeter region PE. The bonding dam 200 may cover an edge portion of an upper surface of the image sensor chip 100-2. The bonding dam 200 may be on the plurality of chip pads 120 by overlapping the plurality of chip pads 120.

When the bonding dam 200 is formed, the plurality of block patterns 152-2 may prevent the bonding dam 200 from intruding into the APS region 110, and thus, the size of the image sensor chip 100-2 may be reduced, and accordingly, the size of the image sensor package 10-2 may be reduced. In addition, the plurality of block patterns 152-2 may reduce stress resulting from a thermal expansion coefficient difference in the perimeter region PE to suppress a crack occurrence phenomenon and a peeling phenomenon of the image sensor package 10-2, thereby improving package reliability.

The encapsulation layer 320 may be formed to cover a side surface portion of the image sensor chip 100-2 and the side surface portion of the bonding dam 200. The cover glass 400 may be on the side surface portion of the encapsulation layer 320 and the upper surface of the bonding dam 200.

Figure 8:
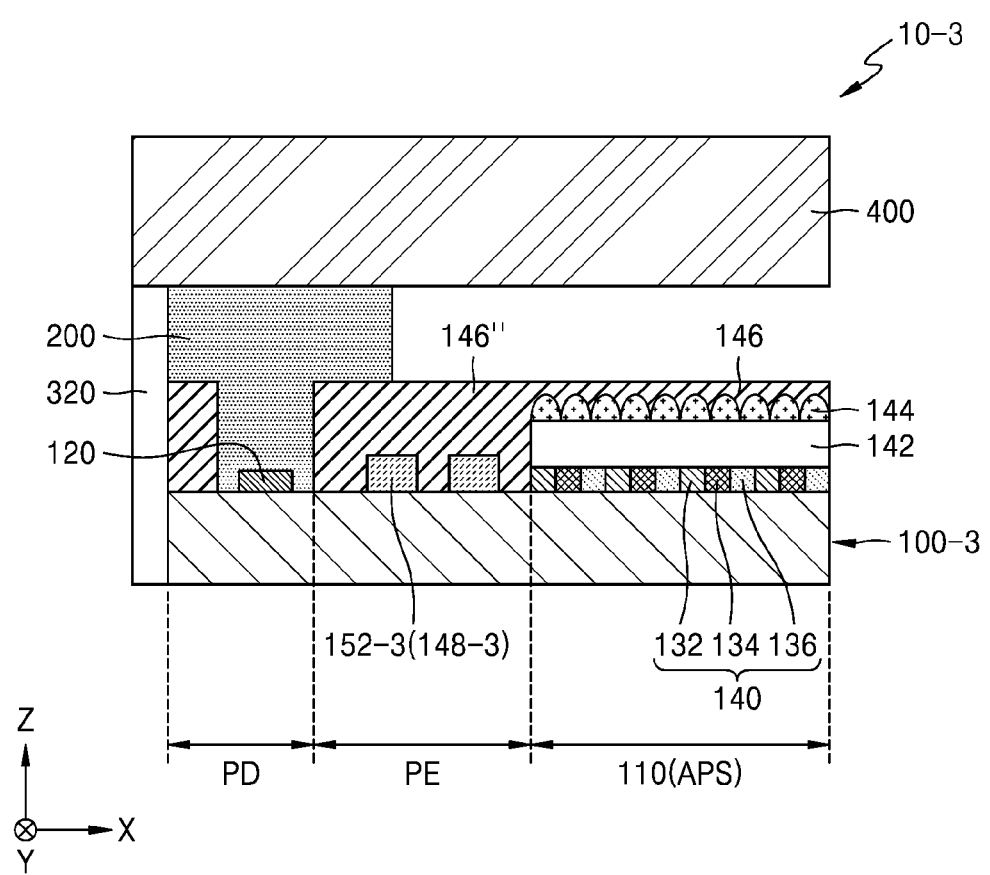
FIG. 8 is a partially enlarged cross-sectional view of an image sensor package according to an embodiment.

FIG. 8 is a partially enlarged cross-sectional view of an image sensor package 10-3 according to an embodiment.

Particularly, when compared with the image sensor package 10-1 of FIG. 6, the image sensor package 10-3 may be the same as the image sensor package 10-1 except for block patterns 152-3. In FIG. 8, a description made with reference to FIG. 6 is simply repeated or omitted. The perimeter planarization pattern 150 of FIG. 6 is not present in FIG. 8.

The image sensor package 10-3 may include an image sensor chip 100-3, the bonding dam 200, the encapsulation layer 320, and the cover glass 400. The image sensor chip 100-3 may include the APS region 110, the perimeter region PE, and the pad region PD.

The APS region 110 may include the color filter layer 140, the planarization layer 142, the microlens layer 144, and the passivation layer 146. The color filter layer 140 may include the red color layer 132, the green color layer 134, and the blue color layer 136.

The perimeter region PE may include a plurality of block patterns, e.g., two block patterns 152-3, formed to be separated from each other. Each of the block patterns 152-3 may include a single pattern including a perimeter color pattern 148-3. The perimeter passivation layer 146" completely covering the block patterns 152-3 may be in the perimeter region PE. The perimeter passivation layer 146" may include the same material as that of the passivation layer 146 in the APS region 110.

In some embodiments, the perimeter color pattern 148-3 may be a black color pattern. The upper surface level of the perimeter passivation layer 146" may be the same as the upper surface level of the passivation layer 146.

The pad region PD may include the plurality of chip pads 120. The bonding dam 200 may be in the pad region PD and in a portion of the perimeter region PE. The bonding dam 200 may cover an edge portion of an upper surface of the image sensor chip 100-3. The bonding dam 200 may be on the plurality of chip pads 120 by overlapping the plurality of chip pads 120.

When the bonding dam 200 is formed, the plurality of block patterns 152-3 may prevent the bonding dam 200 from intruding into the APS region 110, and thus, the size of the image sensor chip 100-3 may be reduced, and accordingly, the size of the image sensor package 10-3 may be reduced. In addition, the plurality of block patterns 152-3 may reduce stress resulting from a thermal expansion coefficient difference in the perimeter region PE to suppress a crack occurrence phenomenon and a peeling phenomenon of the image sensor package 10-3, thereby improving package reliability.

The encapsulation layer 320 may be formed to cover a side surface portion of the image sensor chip 100-3 and the side surface portion of the bonding dam 200. The cover glass 400 may be on the side surface portion of the encapsulation layer 320 and the upper surface of the bonding dam 200.

Figure 9:
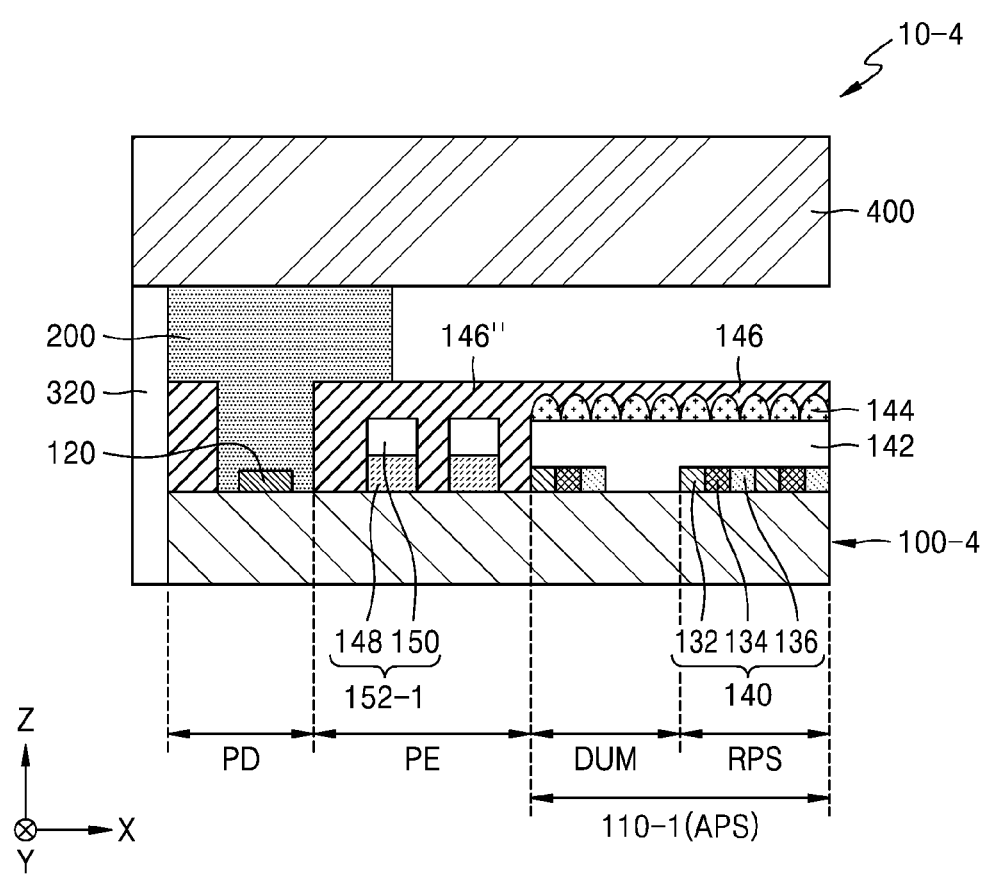
FIG. 9 is a partially enlarged cross-sectional view of an image sensor package according to an embodiment.

FIG. 9 is a partially enlarged cross-sectional view of an image sensor package 10-4 according to an embodiment.

Particularly, when compared with the image sensor package 10-1 of FIG. 6, the image sensor package 10-4 may be the same as the image sensor package 10-1 except for an APS region 110-1. In FIG. 9, a description made with reference to FIG. 6 is simply repeated or omitted. FIG. 9, as described below, includes a dummy pixel sensor region DUM in the APS region 110-1. FIG. 6 does not include a dummy pixel sensor region DUM in the APS region 110-1.

The image sensor package 10-4 may include an image sensor chip 100-4, the bonding dam 200, the encapsulation layer 320, and the cover glass 400. The image sensor chip 100-4 may include the APS region 110-1, the perimeter region PE, and the pad region PD.

The APS region 110-1 may include a real pixel sensor region RPS for sensing light and the dummy pixel sensor region DUM, which is in the perimeter of the real pixel sensor region RPS and does not sense light. The APS region 110-1 may include the color filter layer 140, the planarization layer 142, the microlens layer 144, and the passivation layer 146.

The color filter layer 140 may include the red color layer 132, the green color layer 134, and the blue color layer 136. The color filter layer 140 in the real pixel sensor region RPS and the color filter layer 140 in the dummy pixel sensor region DUM may be separated from each other.

The perimeter region PE may include a plurality of block patterns, e.g., two block patterns 152-1, formed to be separated from each other. Each of the block patterns 152-1 may include a double pattern including the perimeter color pattern 148 and the perimeter planarization pattern 150 on the perimeter color pattern 148. The perimeter passivation layer 146" completely covering the block patterns 152-1 may be in the perimeter region PE. The perimeter passivation layer 146" may include the same material as that of the passivation layer 146 in the APS region 110-1.

In some embodiments, the perimeter color pattern 148 may be a black color pattern. The perimeter planarization pattern 150 may include the same material as that of the planarization layer 142 in the APS region 110-1. In some embodiments, the upper surface level of the perimeter planarization pattern 150 may be the same as the upper surface level of the planarization layer 142. The upper surface level of the perimeter passivation layer 146" may be the same as the upper surface level of the passivation layer 146.

The pad region PD may include the plurality of chip pads 120. The plurality of chip pads 120 may be separated by the perimeter passivation layer 146". The bonding dam 200 may be in the pad region PD and in a portion of the perimeter region PE. The bonding dam 200 may cover an edge portion of an upper surface of the image sensor chip 100-4. The bonding dam 200 may be on the plurality of chip pads 120 by overlapping the plurality of chip pads 120.

When the bonding dam 200 is formed, the plurality of block patterns 152-1 may prevent the bonding dam 200 from intruding into the APS region 110-1, and thus, the size of the image sensor chip 100-4 may be reduced, and accordingly, the size of the image sensor package 10-4 may be reduced. In addition, the plurality of block patterns 152-3 may reduce stress resulting from a thermal expansion coefficient difference in the perimeter region PE to suppress a crack occurrence phenomenon and a peeling phenomenon of the image sensor package 10-4, thereby improving package reliability.

The encapsulation layer 320 may be formed to cover a side surface portion of the image sensor chip 100-4 and the side surface portion of the bonding dam 200. The cover glass 400 may be on the side surface portion of the encapsulation layer 320 and the upper surface of the bonding dam 200.

Figure 10:
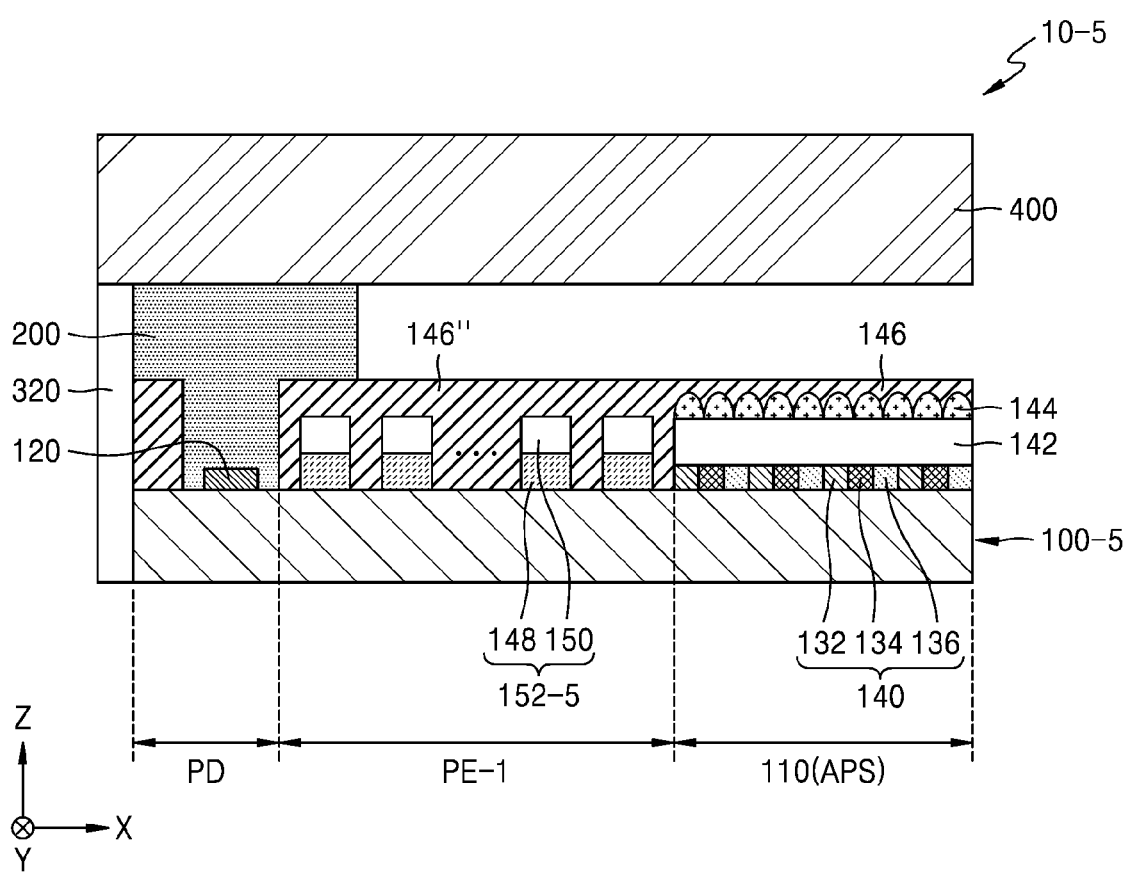
FIG. 10 is a partially enlarged cross-sectional view of an image sensor package according to an embodiment.
Figure 11:
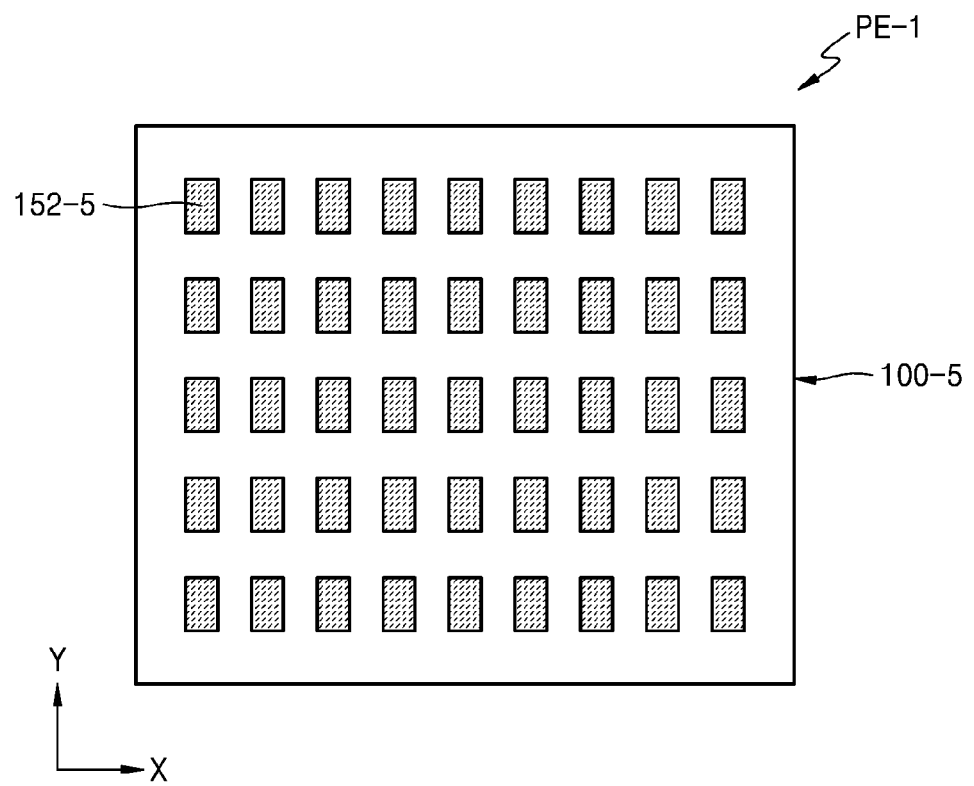
FIG. 11 is a top view of a perimeter region of an image sensor chip of FIG. 10.

FIG. 10 is a partially enlarged cross-sectional view of an image sensor package 10-5 according to an embodiment, and FIG. 11 is a top view of a perimeter region PE-1 of an image sensor chip 100-5 of FIG. 10.

Particularly, when compared with the image sensor package 10-1 of FIG. 6, the image sensor package 10-5 may be the same as the image sensor package 10-1 except for the perimeter region PE-1. In FIGS. 10 and 11, a description made with reference to FIG. 6 is simply repeated or omitted.

The image sensor package 10-5 may include the image sensor chip 100-5, the bonding dam 200, the encapsulation layer 320, and the cover glass 400. The image sensor chip 100-5 may include the APS region 110, the perimeter region PE-1, and the pad region PD.

The APS region 110 may include the color filter layer 140, the planarization layer 142, the microlens layer 144, and the passivation layer 146. The color filter layer 140 may include the red color layer 132, the green color layer 134, and the blue color layer 136.

The perimeter region PE-1 may include a plurality of block patterns 152-5 formed to be separated from each other. In the perimeter region PE-1, the plurality of block patterns 152-5 may be separated from each other in the X-axis direction and the Y-axis direction, as shown in FIG. 11. Although FIG. 11 shows a top view shape of the plurality of block patterns 152-5 to be quadrangular, the top view shape may be polygonal, e.g., triangular, pentagonal, or the like, in accordance with circumstances.

Each of the plurality of block patterns 152-5 may include a double pattern including the perimeter color pattern 148 and the perimeter planarization pattern 150 on the perimeter color pattern 148, as shown in FIG. 10. The perimeter passivation layer 146" completely covering the plurality of block patterns 152-5 may be in the perimeter region PE-1. The perimeter passivation layer 146" may include the same material as that of the passivation layer 146 in the APS region 110.

In some embodiments, the perimeter color pattern 148 may be a black color pattern. The perimeter planarization pattern 150 may include the same material as that of the planarization layer 142 in the APS region 110-1. In some embodiments, the upper surface level of the perimeter planarization pattern 150 may be the same as the upper surface level of the planarization layer 142. The upper surface level of the perimeter passivation layer 146" may be the same as the upper surface level of the passivation layer 146.

The pad region PD may include the plurality of chip pads 120. The bonding dam 200 may be in the pad region PD and in a portion of the perimeter region PE. The bonding dam 200 may cover an edge portion of an upper surface of the image sensor chip 100-5. The bonding dam 200 may be on the plurality of chip pads 120 by overlapping the plurality of chip pads 120.

When the bonding dam 200 is formed, the plurality of block patterns 152-5 may prevent the bonding dam 200 from intruding into the APS region 110, and thus, the size of the image sensor chip 100-5 may be reduced, and accordingly, the size of the image sensor package 10-5 may be reduced. In addition, the plurality of block patterns 152-5 may reduce stress resulting from a thermal expansion coefficient difference in the perimeter region PE-1 to suppress a crack occurrence phenomenon and a peeling phenomenon of the image sensor package 10-5, thereby improving package reliability.

The encapsulation layer 320 may be formed to cover a side surface portion of the image sensor chip 100-5 and the side surface portion of the bonding dam 200. The cover glass 400 may be on the side surface portion of the encapsulation layer 320 and the upper surface of the bonding dam 200.

Figure 12:
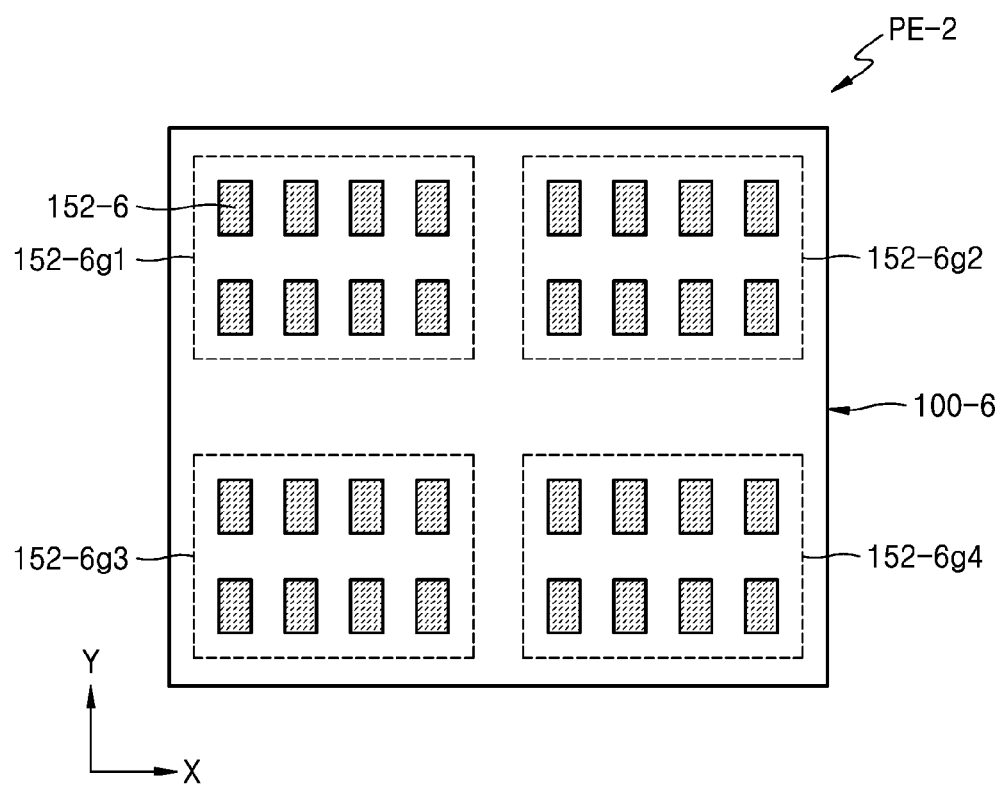
FIG. 12 is a top view of a perimeter region of an image sensor chip used in an image sensor package according to an embodiment.

FIG. 12 is a top view of a perimeter region PE-2 of an image sensor chip 100-6 used in an image sensor package according to an embodiment.

Particularly, when compared with the image sensor chip 100-5 used in FIGS. 10 and 11, the image sensor chip 100-6 may be the same as the image sensor chip 100-5 except for the perimeter region PE-2. The image sensor chip 100-6 may include the perimeter region PE-2.

The perimeter region PE-2 may include a plurality of block patterns 152-6 formed to be separated from each other. In the perimeter region PE-1, the plurality of block patterns 152-6 may be separated from each other in the X-axis direction and the Y-axis direction. The plurality of block patterns 152-6 may include a plurality of block pattern groups 152-6g1 to 152-6g4. The plurality of block pattern groups 152-6g1 to 152-6g4 may be separated from each other.

Although FIG. 12 shows a top view shape of the plurality of block patterns 152-6 to be quadrangular, the top view shape may be polygonal, e.g., triangular, pentagonal, or the like, in accordance with circumstances. In addition, although FIG. 12 shows that the plurality of block patterns 152-6 include four block pattern groups 152-6g1 to 152-6g4, the plurality of block patterns 152-6 may include more or less block pattern groups in accordance with circumstances.

Each of the plurality of block patterns 152-6 may have the same structure as the block patterns 152-5 that in FIG. 10. Each of the plurality of block patterns 152-6 may include a double pattern including the perimeter color pattern 148 (see FIG. 10) and the perimeter planarization pattern 150 (see FIG. 10). The perimeter passivation layer 146" (see FIG. 10) completely covering the plurality of block patterns 152-6 may be in the perimeter region PE-2.

When the bonding dam 200 (see FIG. 10) is formed, the plurality of block patterns 152-6 may effectively prevent the bonding dam 200 from intruding into the APS region 110 (see FIG. 10), and thus, the size of the image sensor chip 100-5 (see FIG. 10) may be reduced, and accordingly, the size of the image sensor package 10-5 (see FIG. 10) may be reduced. In addition, the plurality of block patterns 152-6 may reduce stress resulting from a thermal expansion coefficient difference in the perimeter region PE-2 to suppress a crack occurrence phenomenon and a peeling phenomenon of the image sensor package 10-5 (see FIG. 10), thereby improving package reliability.

Figure 13:
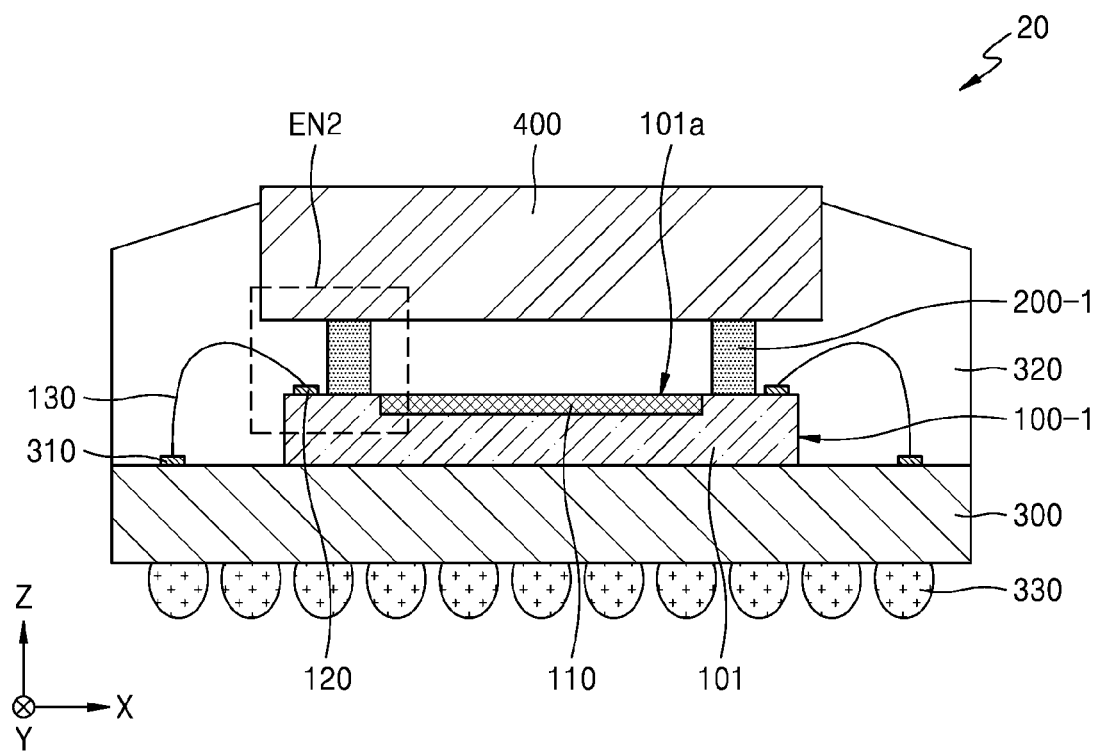
FIG. 13 is a cross-sectional view of an image sensor package according to an embodiment.
Figure 14:
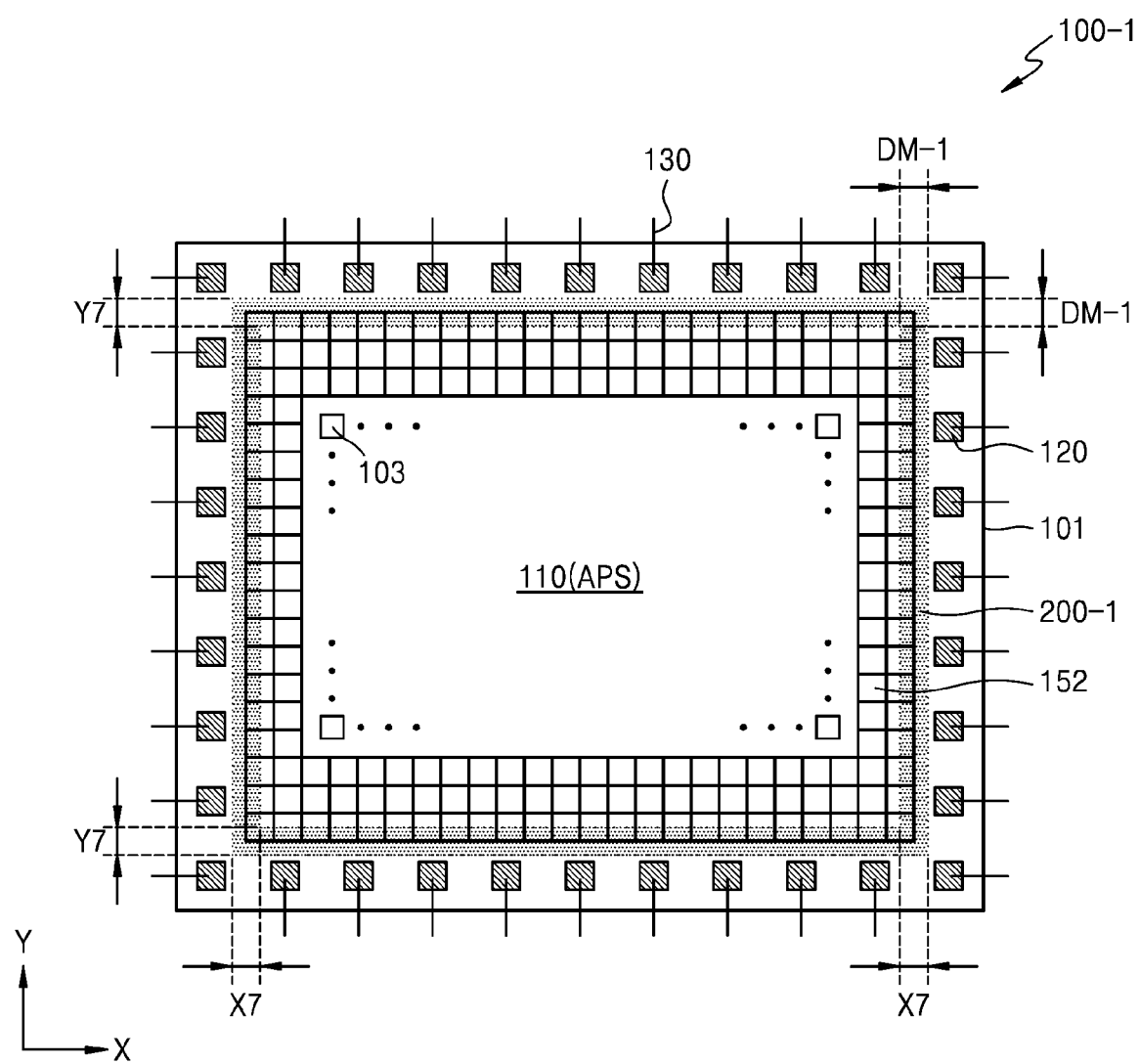
FIG. 14 is a top view of a bonding dam attached onto the image sensor chip of FIG. 13.

FIG. 13 is a cross-sectional view of an image sensor package 20 according to an embodiment, and FIG. 14 is a top view of a bonding dam 200-1 attached onto the image sensor chip 100-1 of FIG. 13.

Particularly, when compared with the image sensor package 10 of FIG. 1, the image sensor package 20 of FIG. 13 may be the same as the image sensor package 10 except that the bonding dam 200-1 is located at an inner side of the image sensor chip 100-1 without overlapping the plurality of chip pads 120. Compared with FIGS. 2 and 3, FIG. 14 is the same as FIGS. 2 and 3 except for a forming location of the bonding dam 200-1. In FIGS. 13 and 14, a description made with reference to FIGS. 1 to 3 is simply repeated or omitted.

The image sensor package 20 may include the image sensor chip 100-1, the bonding wires 130, the bonding dam 200-1, the PCB 300, the encapsulation layer 320, the plurality of bumps 330, and the cover glass 400. The image sensor chip 100-1 may include the APS region 110, in which the plurality of unit pixels 103 are arranged in an array form.

The bonding dam 200-1 may be formed between the image sensor chip 100-1 and the cover glass 400 and bond the image sensor chip 100-1 with the cover glass 400. The bonding dam 200-1 does not overlap the plurality of chip pads 120. The cover glass 400 may be on the bonding dam 200-1 and above the image sensor chip 100-1.

The bonding dam 200-1 may be separated from the edge of the image sensor chip 100-1 and arranged in a dam region DM-1 having a width (or distance) X7 in the X-axis direction. In other words, the bonding dam 200-1 may be separated from the edge of the image sensor chip 100-1 and have the width (or distance) X7 in the X-axis direction. The width X7 of the bonding dam 200-1 in the X-axis direction, which is arranged in each of the left and right sides of the APS region 110, may be about 2 mm or less.

In addition, the bonding dam 200-1 may be separated from the edge of the image sensor chip 100-1 and arranged in the dam region DM-1 having a width (or distance) Y7 in the Y-axis direction. In other words, the bonding dam 200-1 may be separated from the edge of the image sensor chip 100-1 and have the width (or distance) Y7 in the Y-axis direction. The width Y7 of the bonding dam 200-1 in the Y-axis direction, which is arranged in each of the upper and lower sides of the APS region 110, may be about 2 mm or less.

As shown in FIG. 13, the cover glass 400 may be on the bonding dam 200-1 and bonded with an upper part of the image sensor chip 100-1. The bonding dam 200-1 may be formed at an edge portion of the image sensor chip 100-1 and bond the cover glass 400 to the image sensor chip 100.

The encapsulation layer 320 may be formed to cover all of upper portions of the plurality of chip pads 120 located at an edge of the image sensor chip 100-1, a side surface portion of the bonding dam 200-1, the side surface portion of the cover glass 400, and the edge portion of the upper surface of the PCB 300.

As shown in FIG. 13, when the width of the cover glass 400 is greater than a width of the image sensor chip 100-1, the encapsulation layer 320 may also be formed at the edge portion of the lower surface of the cover glass 400. The image sensor chip 100-1 may be bonded with the cover glass 400 by using the bonding dam 200-1 and the encapsulation layer 320.

Figure 15:
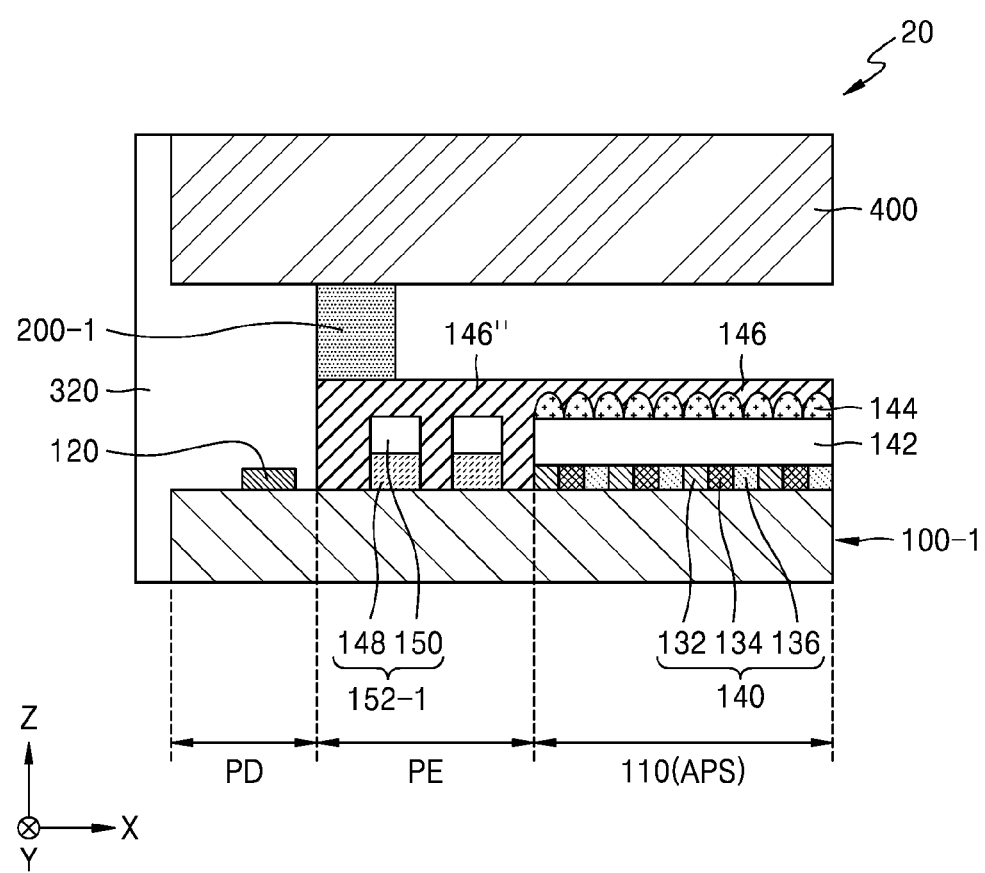
FIG. 15 is a partially enlarged cross-sectional view of an example of the image sensor package of FIG. 13.

FIG. 15 is a partially enlarged cross-sectional view of an example of the image sensor package 20 of FIG. 13.

Particularly, FIG. 15 is an enlarged cross-sectional view of a portion EN2 of the image sensor package 20 of FIG. 13. The image sensor package 20 may include the image sensor chip 100-1, the bonding dam 200-1, the encapsulation layer 320, and the cover glass 400. The image sensor chip 100-1 may include the APS region 110, the perimeter region PE at one side of the APS region 110, and the pad region PD at one side of the perimeter region PE.

The APS region 110 may include the color filter layer 140, the planarization layer 142 on the color filter layer 140, the microlens layer 144 on the planarization layer 142, and the passivation layer 146 on the microlens layer 144.

The color filter layer 140 may include the red color layer 132, the green color layer 134, and the blue color layer 136. The planarization layer 142 may be a material layer introduced when the upper surface of the color filter layer 140 is uneven. The passivation layer 146 may be a material layer for protecting the APS region 110.

The perimeter region PE may include a plurality of block patterns, e.g., two block patterns 152-1, formed to be separated from each other. Each of the block patterns 152-1 may include a double pattern including the perimeter color pattern 148 and the perimeter planarization pattern 150 on the perimeter color pattern 148. The perimeter passivation layer 146" completely covering the block patterns 152-1 may be in the perimeter region PE. The perimeter passivation layer 146" may include the same material as that of the passivation layer 146 in the APS region 110.

In some embodiments, the perimeter color pattern 148 may be a black color pattern. The perimeter planarization pattern 150 may include the same material as that of the planarization layer 142 in the APS region 110. In some embodiments, the upper surface level of the perimeter planarization pattern 150 may be the same as the upper surface level of the planarization layer 142. The upper surface level of the perimeter passivation layer 146" may be the same as the upper surface level of the passivation layer 146.

The pad region PD may include the plurality of chip pads 120. The plurality of chip pads 120 may be separated by the perimeter passivation layer 146". The bonding dam 200-1 may be in a portion of the perimeter region PE. The bonding dam 200-1 may be located not to overlap the plurality of chip pads 120 of the image sensor chip 100-1.

When the bonding dam 200-1 is formed, the plurality of block patterns 152-1 may prevent the bonding dam 200-1 from intruding into the APS region 110, and thus, the size of the image sensor chip 100-1 may be reduced, and accordingly, the size of the image sensor package 20 may be reduced. In addition, the plurality of block patterns 152-1 may reduce stress resulting from a thermal expansion coefficient difference in the perimeter region PE to suppress a crack occurrence phenomenon and a peeling phenomenon of the image sensor package 20, thereby improving package reliability.

The encapsulation layer 320 may be formed to cover the side surface portion of the image sensor chip 100-1, the upper portions of the plurality of chip pads 120 located at the edge of the image sensor chip 100-1, and the side surface portion of the bonding dam 200-1. The cover glass 400 may be on the side surface portion of the encapsulation layer 320 and the upper surface of the bonding dam 200-1.

Figure 16:
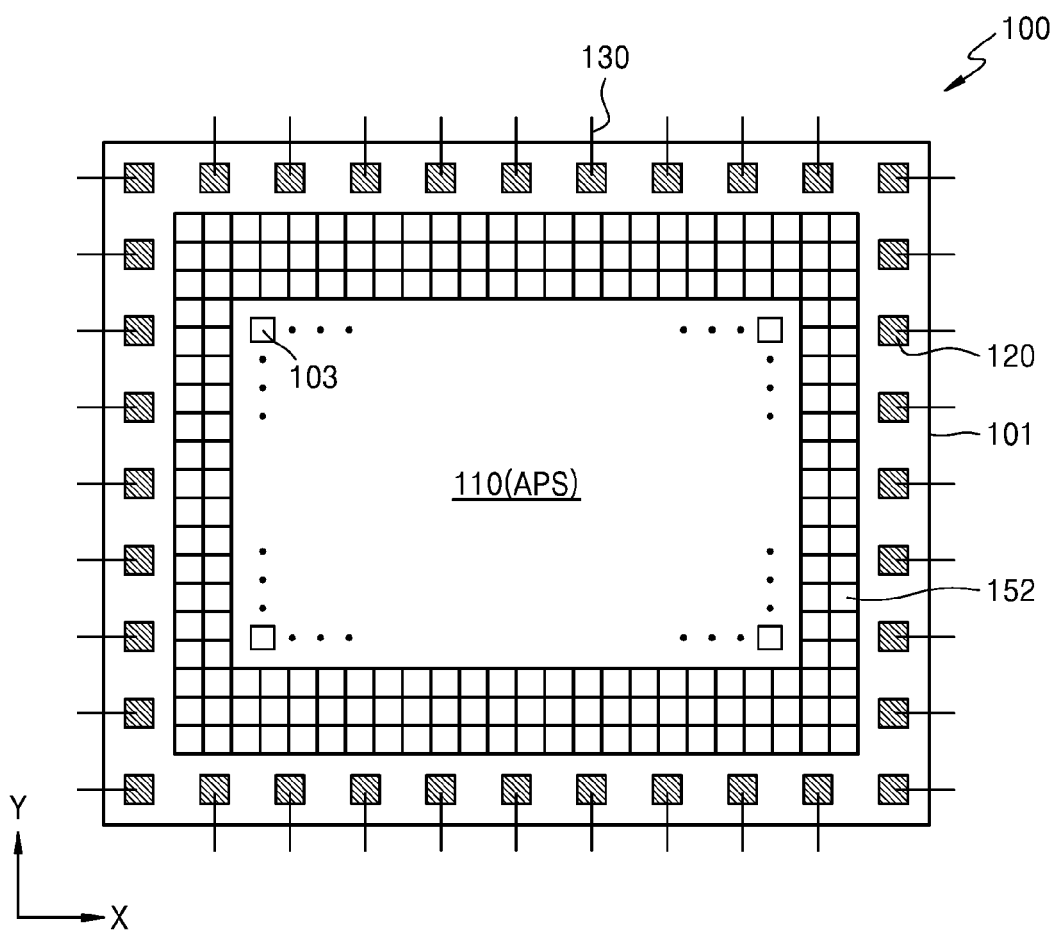
FIGS. 16 to 18 are top views and a cross-sectional view for describing a method of manufacturing an image sensor package, according to an embodiment.
Figure 17:
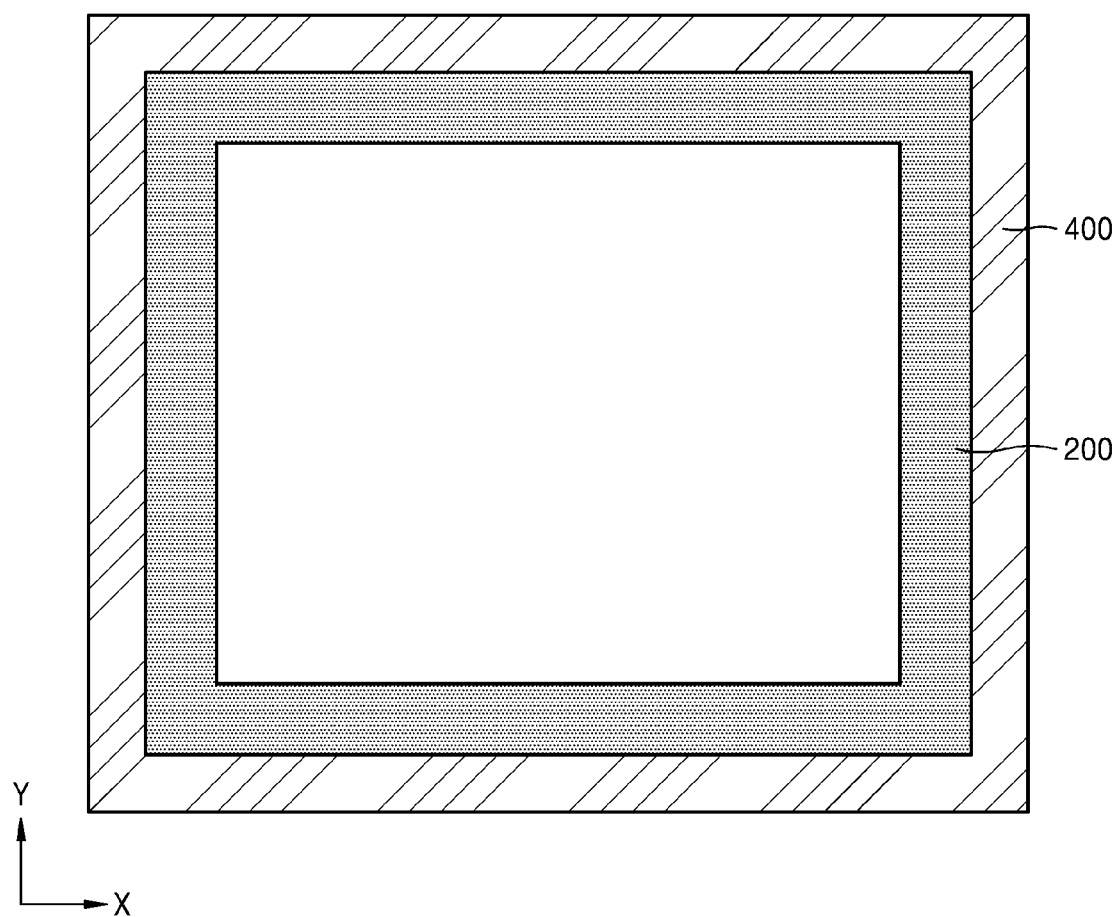
Figure 18:
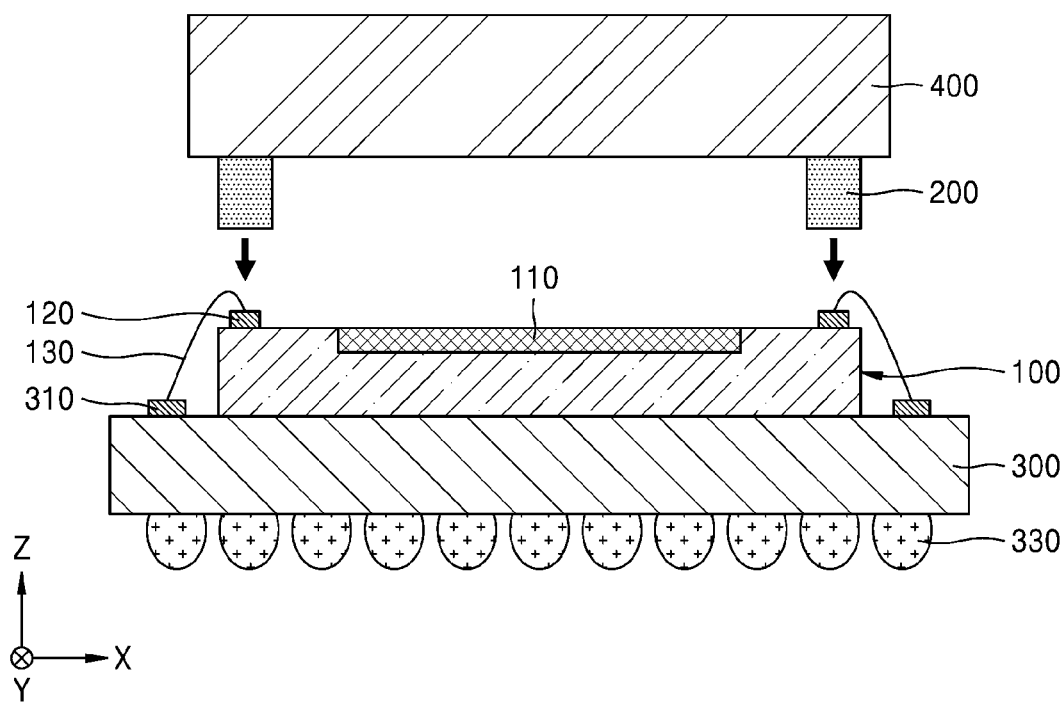

FIGS. 16 to 18 are top views and a cross-sectional view for describing a method of manufacturing an image sensor package, according to an embodiment.

Particularly, FIGS. 16 to 18 are provided to describe a method of manufacturing the image sensor package 10 described with reference to FIGS. 1 to 5. In FIGS. 16 to 18, a description made with reference to FIGS. 1 to 5 is simply repeated or omitted.

FIG. 16 is a top view of the image sensor chip 100 attached to the PCB 300 (see FIG. 1). The image sensor chip 100 may include the APS region 110, in which the plurality of unit pixels 103 are arranged in an array form, the plurality of block patterns 152, and the plurality of chip pads 120 on the semiconductor substrate 101. The bonding wires 130 are respectively connected to the plurality of chip pads 120.

FIG. 17 is a plan view of the bonding dam 200 formed on the lower surface of the cover glass 400. The bonding dam 200 may be formed on the edge portion of the lower surface of the cover glass 400. The bonding dam 200 may be formed by using an adhesive. The bonding dam 200 may be formed by being separated by a certain distance from an edge of the cover glass 400. When the width of the cover glass 400 is the same as the width of the image sensor chip 100, the bonding dam 200 may be formed to be adjacent to the edge of the cover glass 400.

FIG. 18 is a cross-sectional view for describing a process of attaching the bonding dam 200 formed on the lower surface of the cover glass 400 to the image sensor chip 100 attached to the PCB 300. The bonding dam 200 is formed inward from edges of the cover glass 400. The image sensor chip 100 may be bonded with the cover glass 400 by using the bonding dam 200.

Thereafter, as shown in FIG. 1, the encapsulation layer 320 may be formed to cover all of the side surface portion of the image sensor chip 100, the side surface portion of the bonding dam 200, the side surface portion of the cover glass 400, and the edge portion of the upper surface of the PCB 300. The encapsulation layer 320 may be formed to fill an edge of the upper surface of the image sensor chip 100 and an edge of the lower surface of the cover glass 400.

Figure 19:
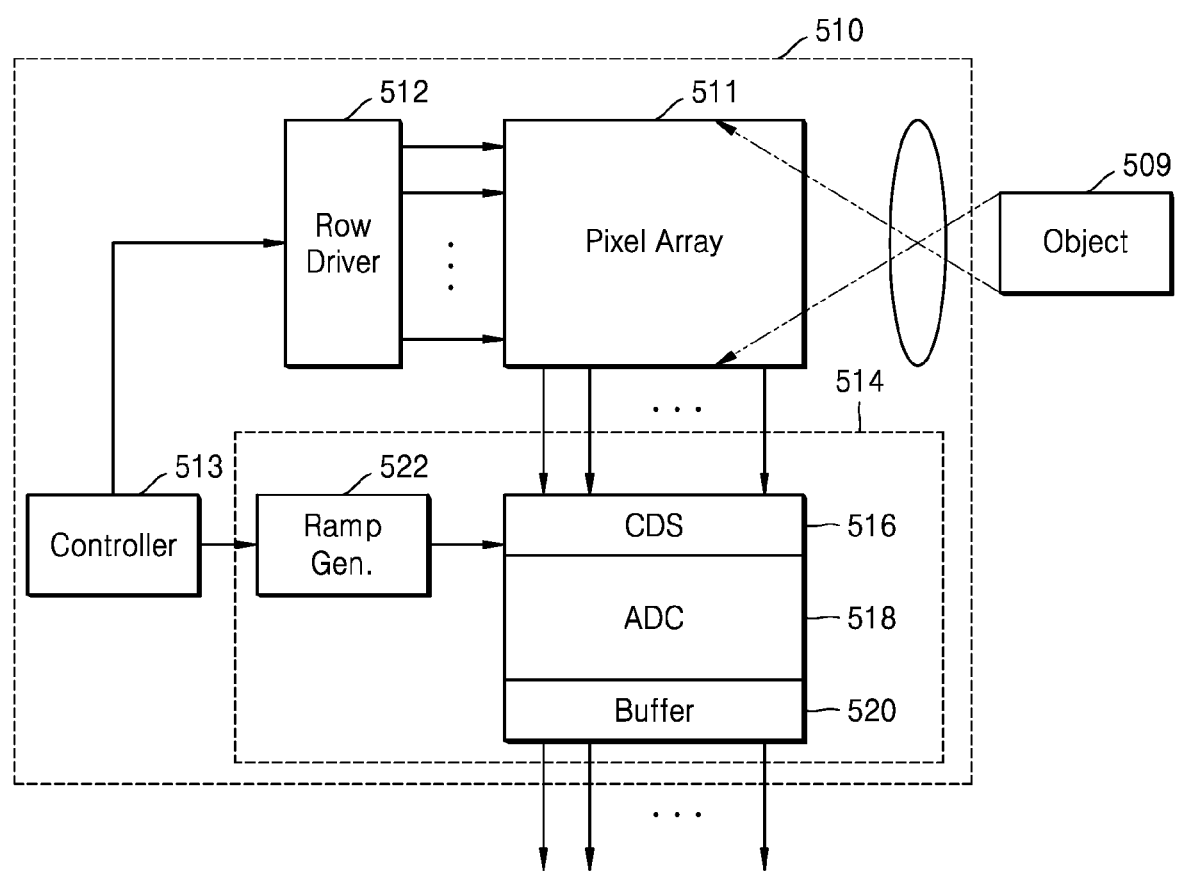
FIG. 19 is a block diagram of components of an image sensor chip according to an embodiment.

FIG. 19 is a block diagram of components of an image sensor chip 510 according to an embodiment.

Particularly, the image sensor chip 510 may be included in the image sensor package 10 or 20 described above. The image sensor chip 510 may include a pixel array 511, a controller 513, a row driver 512, and a pixel signal processor 514. The image sensor chip 510 may include at least one of the image sensor chips 100 and 100-1 to 100-6 described above.

The pixel array 511 may include a plurality of unit pixels two-dimensionally arranged, and each unit pixel may include a photoelectric conversion element. The photoelectric conversion element may absorb light and generate charges, and an electrical signal (an output voltage) according to the generated charges may be provided to the pixel signal processor 514 through vertical signal lines. The plurality of unit pixels included in the pixel array 511 may provide the output voltage one by one in a row unit.

Accordingly, unit pixels of one row of the pixel array 511 may be simultaneously activated by a select signal output from the row driver 512. Unit pixels of a selected row may provide an output voltage corresponding to absorbed light to output lines of a column corresponding to the unit pixels.

The controller 513 may control the pixel array 511 to accumulate charges by absorbing light or temporarily store the accumulated charges, and control the row driver 512 to output an electrical signal according to the stored charges to the outside of the pixel array 511. In addition, the controller 513 may control the pixel signal processor 514 to measure the output voltage provided by the pixel array 511.

The pixel signal processor 514 may include a correlated double sampler (CDS) 516, an analog-digital converter (ADC) 518, and a buffer 520. The CDS 516 may sample and hold the output voltage provided by the pixel array 511. The CDS 516 may double-sample a particular noise level and a level according to a generated output voltage and output a level corresponding to a difference therebetween. In addition, the CDS 516 may receive ramp signals generated by a ramp signal generator 522, compare the ramp signals with each other, and output the comparison result. The ADC 518 may convert, into a digital signal, an analog signal corresponding to the level received from the CDS 516. The buffer 520 may latch the digital signal, and latched signals may be sequentially output to the outside of the image sensor chip 510 and transmitted to an image processor (not shown).

Figure 20:
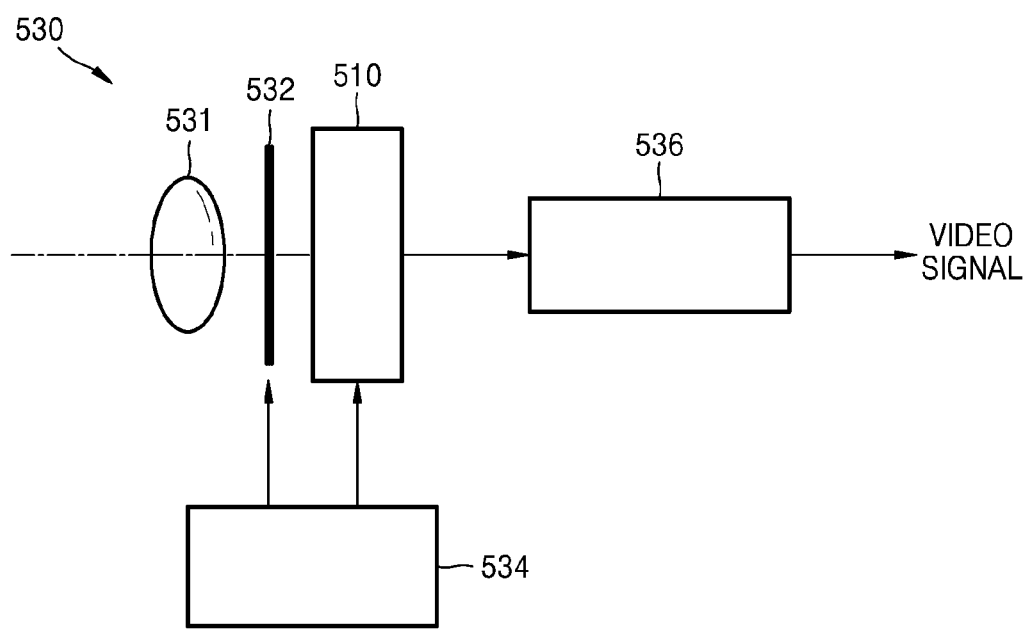
FIG. 20 is a block diagram of a camera using an image sensor chip according to an embodiment.

FIG. 20 is a block diagram of a camera 530 using the image sensor chip 510 according to an embodiment.

Particularly, the camera 530 may include the image sensor chip 510, an optical system 531 guiding incident light to a light-receiving sensor unit of the image sensor chip 510, a driving circuit 534 configured to drive a shutter device 532 and the image sensor chip 510, and a signal processing circuit 536 configured to process an output signal of the image sensor chip 510.

The image sensor chip 510 may be included in the image sensor package 10 or 20 described above. The image sensor chip 510 may include at least one of the image sensor chips 100 and 100-1 to 100-6 described above. The optical system 531 including an optical lens forms image light, i.e., incident light, from an object (509 in FIG. 19) on an image pickup surface of the image sensor chip 510. Accordingly, signal charges are accumulated in the image sensor chip 510 for a certain period of time.

The optical system 531 may be an optical lens system including a plurality of optical lenses. The shutter device 532 controls a light emission period of time and a light-blocking period of time for the image sensor chip 510. The driving circuit 534 supplies a driving signal to the image sensor chip 510 and the shutter device 532, and by the supplied driving signal or a timing signal, a signa output operation from the image sensor chip 510 to the signal processing circuit 536 and a shutter operation of the shutter device 532 are controlled.

By supply of the driving signal or the timing signal from the driving circuit 534, a signal transmission operation from the image sensor chip 510 to the signal processing circuit 536 is performed. The signal processing circuit 536 performs various kinds of signal processing on a signal transmitted from the image sensor chip 510. An image (video) signal on which signal processing has been performed is stored in a storage medium, such as a memory, or output to a monitor.

Figure 21:
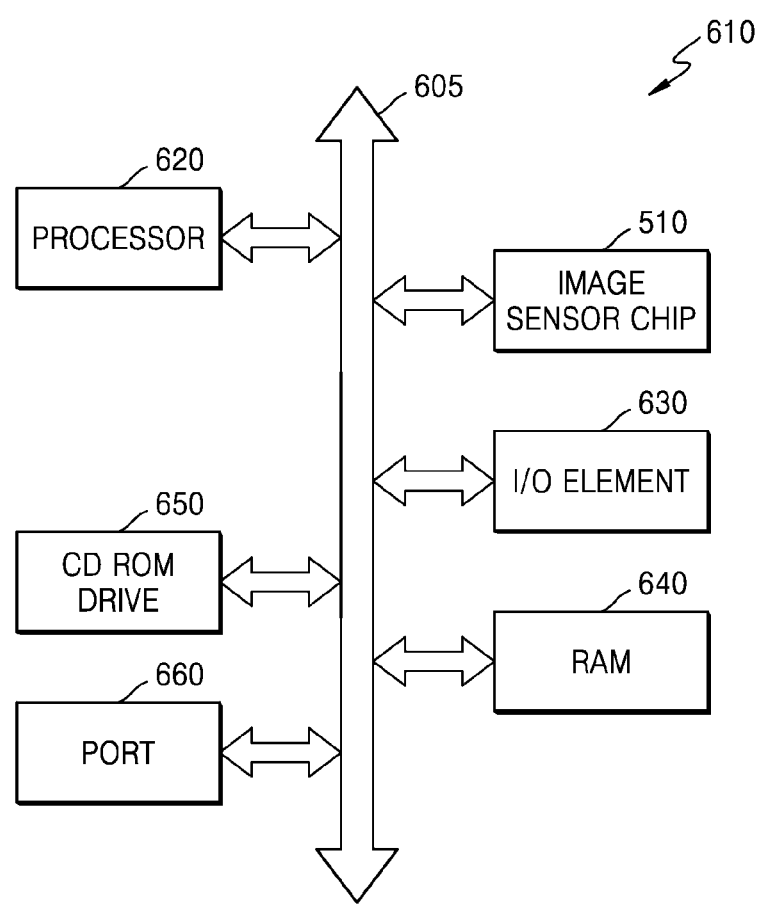
FIG. 21 is a block diagram of an imaging system including an image sensor chip according to an embodiment.

FIG. 21 is a block diagram of an imaging system 610 including the image sensor chip 510 according to an embodiment.

Particularly, the imaging system 600 is a system configured to process an output image of the image sensor chip 510. The image sensor chip 510 may be included in the image sensor package 10 or 20 described above. The image sensor chip 510 may include at least one of the image sensor chips 100 and 100-1 to 100-6 described above. The imaging system 600 may be every type of electrical and electronic system having the image sensor chip 510 mounted therein, such as a computer system, a camera system, a scanner, or an image safety system.

The imaging system 600 based on a processor, such as a computer system, may include a processor 620, such as a microprocessor or a central processing unit (CPU), capable of communicating with an input/output (I/O) element 630 via a bus 605. The processor 620 may be connected to and exchange data with a compact disc read only memory (CD ROM) drive 650, a port 660, and random access memory (RAM) 640 via the bus 605 and reproduce an output image with respect to the data of the image sensor chip 510.

The port 660 may include a port to which a video card, a sound card, a memory card, a universal serial bus (USB) element, or the like is coupled, or through which data may be communicated with another system. The image sensor chip 510 may be integrated with processors, such as a CPU, a digital signal processor (DSP), and a microprocessor, and also be integrated with a memory. Of course, in accordance with circumstances, the image sensor chip 510 may be integrated as an individual chip separated from the processors. The imaging system 600 may be a digital device, such as a camera phone or a digital camera.

Various changes in form and details may be made in the embodiments provided herein without departing from the spirit and scope of the following claims.

What is claimed is:

1. An image sensor package comprising:
   an image sensor chip comprising an active pixel sensor region including a plurality of unit pixels, a perimeter region in a first circumference of the active pixel sensor region, and a pad region in a second circumference of the perimeter region and including a plurality of chip pads;
   a printed circuit board under the image sensor chip and including a plurality of bonding pads;
   bonding wires connecting the plurality of chip pads to the plurality of bonding pads, respectively;
   a bonding dam around the active pixel sensor region;
   a cover glass on the bonding dam and above the image sensor chip; and
   an encapsulation layer to cover all of a first side surface portion of the bonding dam, a second side surface portion of the cover glass, and a first edge portion of a first upper surface of the printed circuit board,
   wherein the perimeter region comprises a plurality of block patterns to be separated from each other,
   wherein each block pattern of the plurality of block patterns comprises a black color pattern.

2. The image sensor package of claim 1, wherein the plurality of block patterns are formed in a mesh form in a top view.

3. The image sensor package of claim 1, wherein each of the plurality of block patterns comprises a triple pattern including a perimeter color pattern, a perimeter planarization pattern on the perimeter color pattern, and a perimeter passivation pattern on the perimeter planarization pattern.

4. The image sensor package of claim 1, wherein each of the plurality of block patterns comprises a double pattern including a perimeter color pattern and a perimeter planarization pattern on the perimeter color pattern.

5. The image sensor package of claim 1, wherein each of the plurality of block patterns comprises a single pattern including a perimeter planarization pattern or a perimeter color pattern.

6. The image sensor package of claim 1, wherein perimeter passivation layers are further formed between the plurality of block patterns.

7. The image sensor package of claim 1, wherein the plurality of block patterns comprise a plurality of block pattern groups, and the plurality of block pattern groups are separated from each other.

8. The image sensor package of claim 1, wherein the bonding dam is configured to cover a second edge portion of a second upper surface of the image sensor chip and to contact the plurality of chip pads by overlapping the plurality of chip pads.

9. The image sensor package of claim 1, wherein the bonding dam is separated from a second edge portion of a second upper surface of the image sensor chip and does not overlap the plurality of chip pads.

10. An image sensor package comprising:
    an image sensor chip comprising an active pixel sensor region including a plurality of unit pixels, a perimeter region in a first circumference of the active pixel sensor region, and a pad region in a second circumference of the perimeter region and including a plurality of chip pads;
a printed circuit board under the image sensor chip and including a plurality of bonding pads;
bonding wires connecting the plurality of chip pads to the plurality of bonding pads, respectively;
a bonding dam around the active pixel sensor region;
a cover glass on the bonding dam and above the image sensor chip; and
an encapsulation layer to cover all of a first side surface portion of the bonding dam, a second side surface portion of the cover glass, and a first edge portion of a first upper surface of the printed circuit board,
wherein the perimeter region comprises a plurality of block patterns in a mesh shape to be separated from each other and a perimeter passivation layer completely covering the plurality of block patterns,
wherein each block pattern of the plurality of block patterns comprises a black color pattern.

11. The image sensor package of claim 10, wherein each of the plurality of block patterns comprises a double pattern including a perimeter color pattern and a perimeter planarization pattern on the perimeter color pattern.

12. The image sensor package of claim 10, wherein each of the plurality of block patterns comprises a single pattern including a perimeter planarization pattern or a perimeter color pattern.

13. The image sensor package of claim 10, wherein the bonding dam is configured to cover a second edge portion of a second upper surface of the image sensor chip and to contact the plurality of chip pads by overlapping the plurality of chip pads.

14. The image sensor package of claim 10, wherein the bonding dam is separated from a second edge portion of a second upper surface of the image sensor chip and does not overlap the plurality of chip pads.

15. The image sensor package of claim 10, wherein the active pixel sensor region comprises a real pixel sensor region for sensing light and a dummy pixel sensor region, which is in a perimeter of the real pixel sensor region and does not sense light.

16. An image sensor package comprising:
an image sensor chip comprising an active pixel sensor region including a plurality of unit pixels, a perimeter region in a first circumference of the active pixel sensor region, and a pad region in a second circumference of the perimeter region and including a plurality of chip pads;
a printed circuit board under the image sensor chip and including a plurality of bonding pads;
bonding wires connecting the plurality of chip pads to the plurality of bonding pads, respectively;
a bonding dam around the active pixel sensor region;
a cover glass on the bonding dam and above the image sensor chip; and
an encapsulation layer to cover all of a first side surface portion of the bonding dam, a second side surface portion of the cover glass, and an edge portion of a first upper surface of the printed circuit board,
wherein the active pixel sensor region comprises a color filter layer, a planarization layer on the color filter layer, a micro-lens layer on the planarization layer, and a passivation layer on the micro-lens layer, and
the perimeter region comprises a plurality of block patterns to be separated from each other and a perimeter passivation layer covering the plurality of block patterns and having the same level as a third upper surface of the passivation layer,
wherein each block pattern of the plurality of block patterns comprises a black color pattern.

17. The image sensor package of claim 16, wherein the perimeter region includes a perimeter color region for removing noise due to light reflection.

18. The image sensor package of claim 16, wherein each of the plurality of block patterns comprises a double pattern including a perimeter color pattern and a perimeter planarization pattern on the perimeter color pattern.

19. The image sensor package of claim 16, wherein each of the plurality of block patterns comprises a single pattern including a perimeter color pattern or a perimeter planarization pattern.

20. The image sensor package of claim 16, wherein the plurality of block patterns comprise a plurality of block pattern groups, and the plurality of block pattern groups are separated from each other.

* * * * *